(12) United States Patent
Mlinar et al.

(10) Patent No.: US 10,498,990 B2
(45) Date of Patent: Dec. 3, 2019

(54) IMAGING SYSTEMS WITH HIGH DYNAMIC RANGE AND PHASE DETECTION PIXELS

(71) Applicant: SEMICONDUCTOR COMPONENTS INDUSTRIES, LLC, Phoenix, AZ (US)

(72) Inventors: Marko Mlinar, Horjul (SI); Tomas Geurts, Haasrode (BE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 15 days.

(21) Appl. No.: 16/014,170

(22) Filed: Jun. 21, 2018

(65) Prior Publication Data

US 2018/0302583 A1 Oct. 18, 2018

Related U.S. Application Data

(62) Division of application No. 15/184,170, filed on Jun. 16, 2016, now Pat. No. 10,033,949.

(51) Int. Cl.
*H04N 5/232* (2006.01)
*H04N 5/369* (2011.01)
*H01L 27/146* (2006.01)
*H04N 5/355* (2011.01)

(52) U.S. Cl.
CPC ..... *H04N 5/3696* (2013.01); *H01L 27/14603* (2013.01); *H01L 27/14627* (2013.01); *H01L 27/14643* (2013.01); *H04N 5/23212* (2013.01); *H04N 5/35563* (2013.01)

(58) Field of Classification Search
CPC ................................................ H04N 5/232122
USPC ......................................... 348/345, 349, 350
See application file for complete search history.

(56) References Cited

U.S. PATENT DOCUMENTS

| 9,338,380 | B2 | 5/2016 | Mlinar |
| 2009/0167927 | A1 | 7/2009 | Kusaka |
| 2010/0033611 | A1 | 2/2010 | Lee et al. |
| 2010/0328479 | A1 | 12/2010 | Sambongi |
| 2011/0018974 | A1 | 1/2011 | Wang |
| 2012/0193515 | A1* | 8/2012 | Agranov ................. G01S 3/782 250/208.1 |
| 2013/0038691 | A1 | 2/2013 | Agranov et al. |

(Continued)

FOREIGN PATENT DOCUMENTS

| EP | 2738812 | 6/2014 |
| WO | 2012033578 | 3/2012 |

*Primary Examiner* — Anthony J Daniels
(74) *Attorney, Agent, or Firm* — Treyz Law Group, P.C.; Joseph F. Guihan

(57) ABSTRACT

A pixel may include an inner sub-pixel group and an outer sub-pixel group. The inner sub-pixel group may have a smaller light collecting area than the outer sub-pixel group and therefore be less sensitive to light than the outer sub-pixel group. This may enable the pixel to be used to generate high dynamic range images, even with the sub-pixel groups using the same length integration time. The inner sub-pixel group may be nested within the outer sub-pixel group. Additionally, one or both of the inner sub-pixel group and the outer sub-pixel group can be split into at least two sub-pixels so that the sub-pixel group can be used to gather phase detection data. Adjacent pixels may have sub-pixel groups split in different directions to enable detection of vertical and horizontal edges in a scene.

20 Claims, 19 Drawing Sheets

(56) References Cited

U.S. PATENT DOCUMENTS

| | | |
|---|---|---|
| 2013/0088621 A1 | 4/2013 | Hamada |
| 2013/0161774 A1 | 6/2013 | Okigawa |
| 2013/0222552 A1 | 8/2013 | Agranov et al. |
| 2013/0242148 A1 | 9/2013 | Mlinar et al. |
| 2013/0329095 A1 | 12/2013 | Aoki et al. |
| 2014/0028806 A1 | 1/2014 | Endo |
| 2014/0198245 A1 | 7/2014 | Kunugi et al. |
| 2015/0002713 A1* | 1/2015 | Nomura ............. H04N 5/23212 348/302 |
| 2015/0350583 A1 | 12/2015 | Mauritzson et al. |
| 2016/0286108 A1 | 9/2016 | Fettig et al. |
| 2017/0094210 A1* | 3/2017 | Galor Gluskin ..... H04N 5/3696 |
| 2017/0104942 A1 | 4/2017 | Hirota et al. |
| 2017/0118398 A1 | 4/2017 | Sano |
| 2017/0148828 A1 | 5/2017 | Ito |
| 2017/0243367 A1* | 8/2017 | Lee ........................... G06T 7/70 |
| 2017/0324917 A1 | 11/2017 | Mlinar et al. |
| 2017/0359539 A1 | 12/2017 | Kawabata |
| 2017/0373105 A1 | 12/2017 | Gluskin |

* cited by examiner

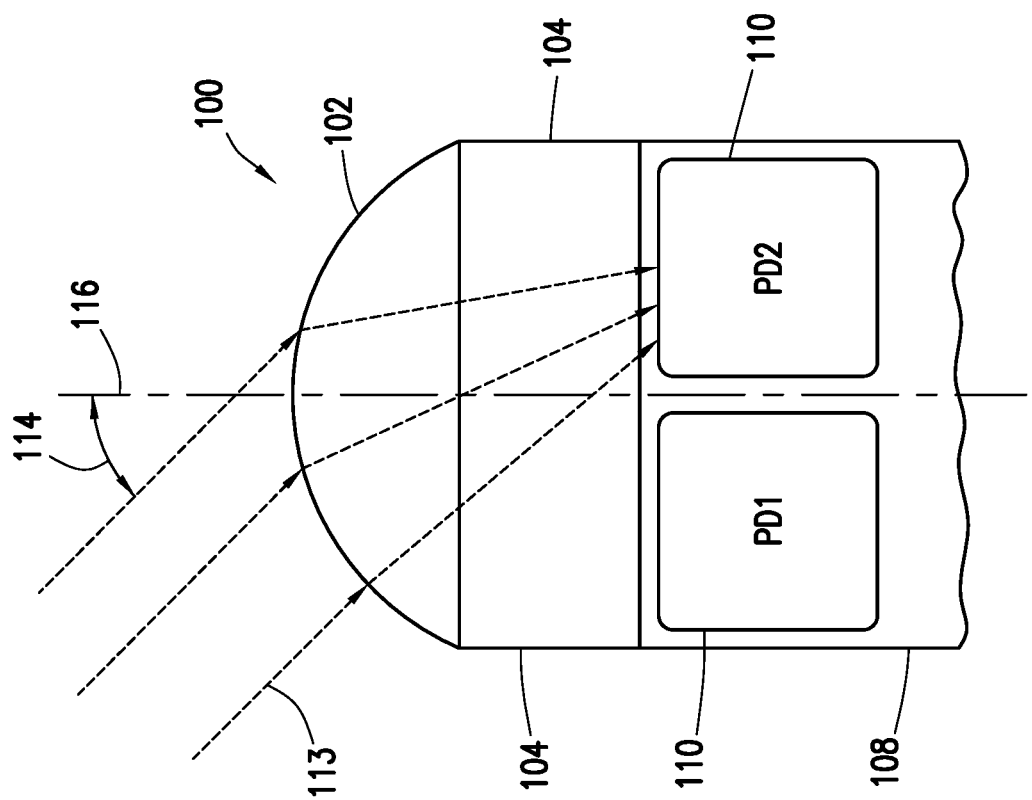
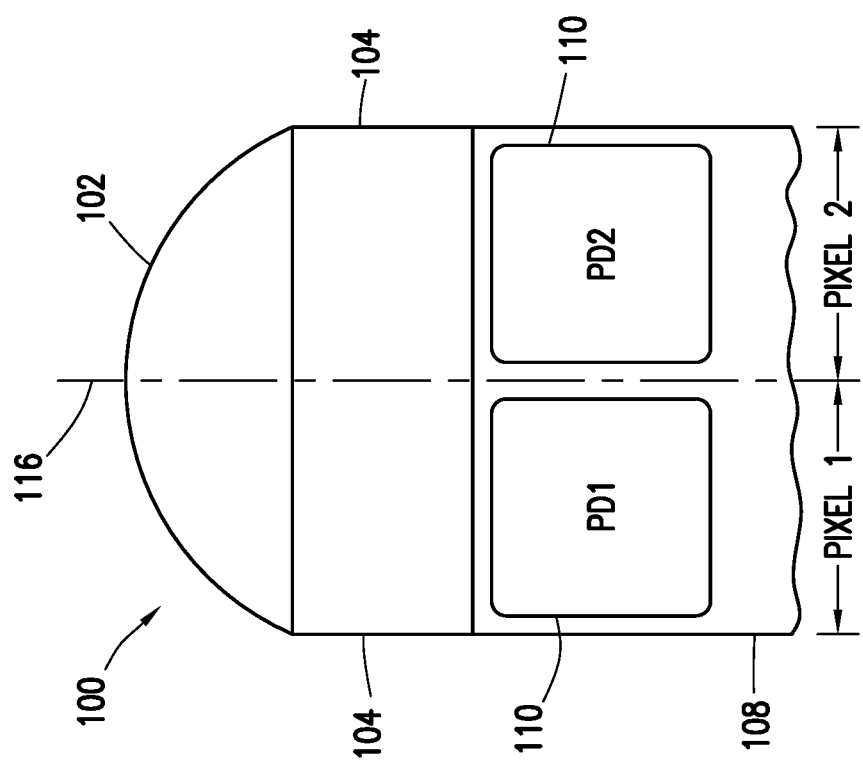

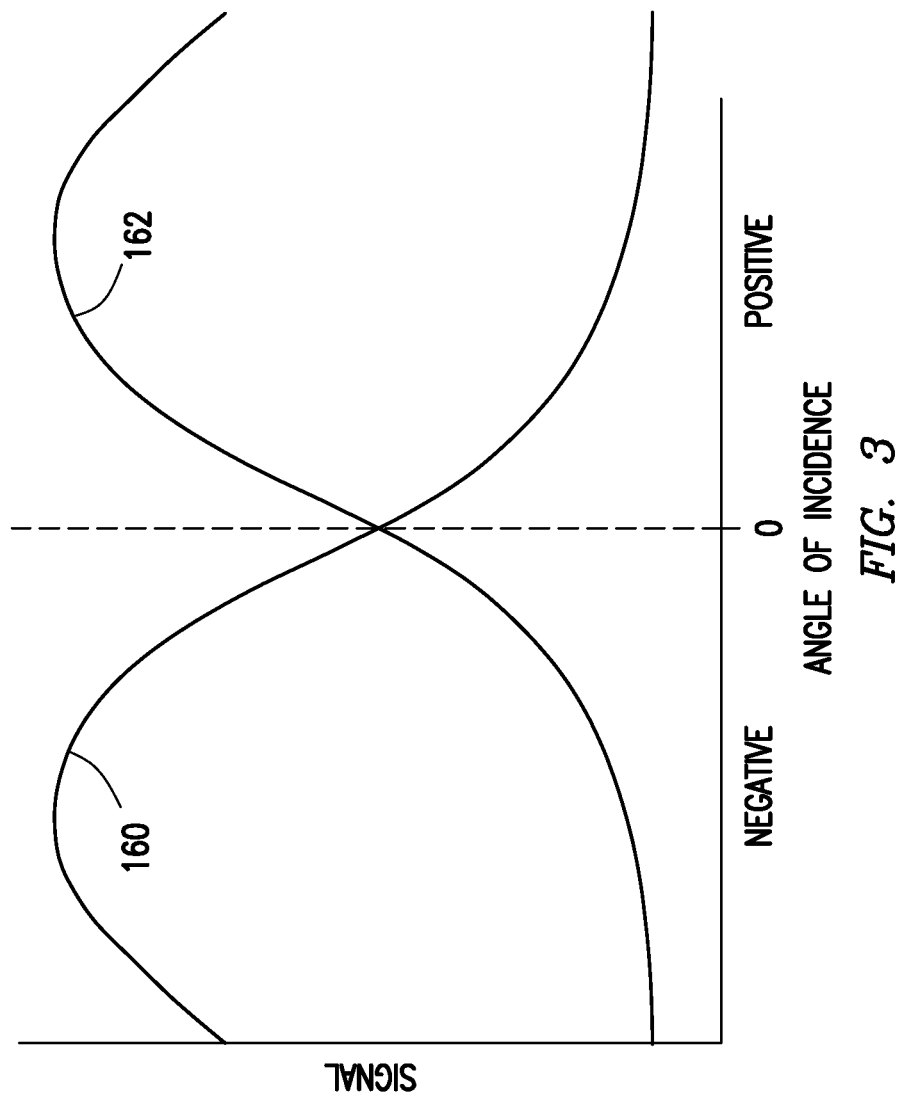

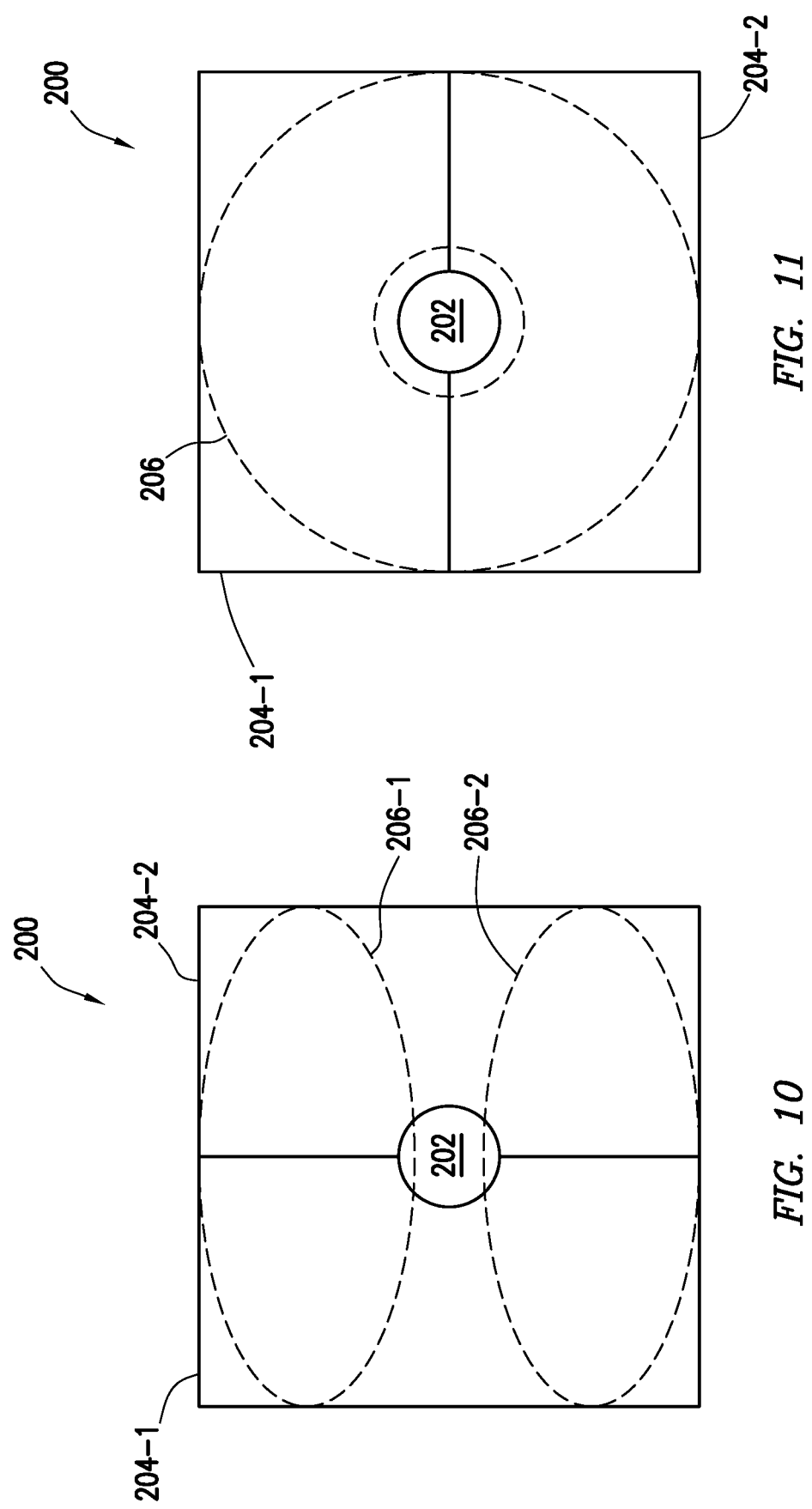

IMAGING SYSTEMS WITH HIGH DYNAMIC RANGE AND PHASE DETECTION PIXELS

This application is a division of U.S. patent application Ser. No. 15/184,170, filed Jun. 16, 2016, which is hereby incorporated by reference herein in its entirety. This application claims the benefit of and claims priority to U.S. patent application Ser. No. 15/184,170, filed Jun. 16, 2016.

BACKGROUND

This relates generally to imaging systems and, more particularly, to imaging systems with high dynamic range functionalities and phase detection capabilities.

Modern electronic devices such as cellular telephones, cameras, and computers often use digital image sensors. Imager sensors (sometimes referred to as imagers) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Some applications such as automatic focusing and three-dimensional (3D) imaging may require electronic devices to provide stereo and/or depth sensing capabilities. For example, to bring an object of interest into focus for an image capture, an electronic device may need to identify the distances between the electronic device and object of interest. To identify distances, conventional electronic devices use complex arrangements. Some arrangements require the use of multiple image sensors and camera lenses that capture images from various viewpoints. Other arrangements require the addition of lenticular arrays that focus incident light on sub-regions of a two-dimensional pixel array. Due to the addition of components such as additional image sensors or complex lens arrays, these arrangements lead to reduced spatial resolution, increased cost, and increased complexity.

Conventional imaging systems also may have images with artifacts associated with low dynamic range. Scenes with bright and dark portions may produce artifacts in conventional image sensors, as portions of the low dynamic range images may be over exposed or under exposed. Multiple low dynamic range images may be combined into a single high dynamic range image, but this typically introduces artifacts, especially in dynamic scenes.

It would therefore be desirable to be able to provide improved imaging systems with high dynamic range functionalities and depth sensing capabilities.

BRIEF DESCRIPTION OF THE DRAWINGS

FIG. 2A is a cross-sectional side view of illustrative phase detection pixels having photosensitive regions with different and asymmetric angular responses in accordance with an embodiment of the present invention.

FIGS. 2B and 2C are cross-sectional views of the phase detection pixels of FIG. 2A in accordance with an embodiment of the present invention.

FIG. 3 is a diagram of illustrative signal outputs of photosensitive regions of depth sensing pixels for incident light striking the depth sensing pixels at varying angles of incidence in accordance with an embodiment of the present invention.

FIG. 10 is a top view of an illustrative pixel with an inner sub-pixel and a split outer sub-pixel group that is covered by two elliptical microlenses in accordance with an embodiment of the present invention.

FIG. 11 is a top view of an illustrative pixel with an inner sub-pixel and vertically oriented outer sub-pixels that is covered by a toroidal microlens in accordance with an embodiment of the present invention.

DETAILED DESCRIPTION

Figure 1:
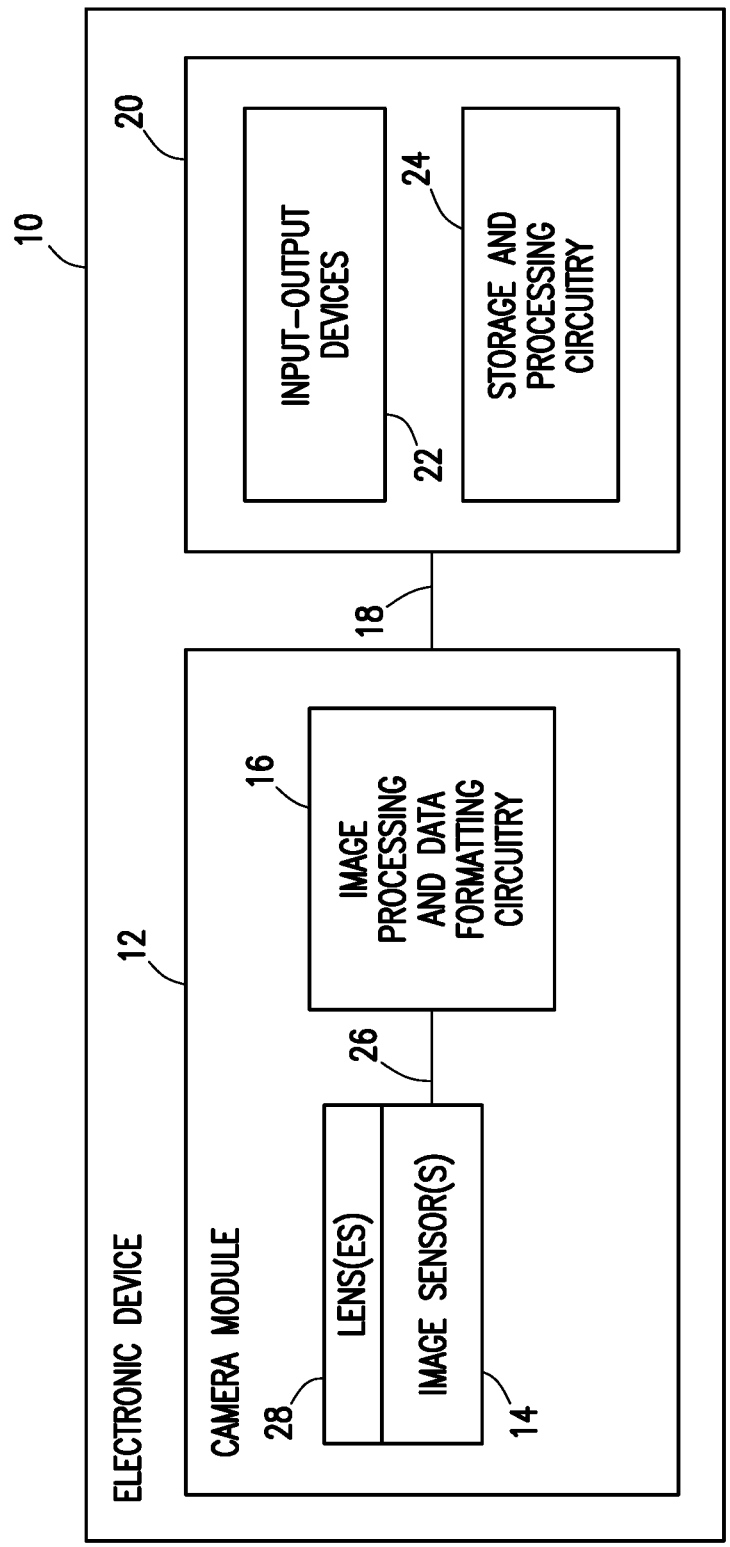
FIG. 1 is a schematic diagram of an illustrative electronic device with an image sensor that may include phase detection pixels in accordance with an embodiment of the present invention.

Embodiments of the present invention relate to image sensors with high dynamic range (HDR) functionalities and depth sensing capabilities. An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, data formatting, adjusting white balance and exposure, implementing video image stabilization, face detection, etc. For example, during automatic focusing operations, image processing and data formatting circuitry 16 may process data gathered by phase detection pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits. If desired, camera sensor 14 and image processing circuitry 16 may be formed on separate semiconductor substrates. For example, camera sensor 14 and image processing circuitry 16 may be formed on separate substrates that have been stacked.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

It may be desirable to provide image sensors with high dynamic range functionalities (e.g., to use in low light and high light environments to compensate for high light points of interest in low light environments and vice versa). To provide high dynamic range functionalities, image sensor 14 may include high dynamic range pixels.

It may be desirable to provide image sensors with depth sensing capabilities (e.g., to use in automatic focusing applications, 3D imaging applications such as machine vision applications, etc.). To provide depth sensing capabilities, image sensor 14 may include phase detection pixel groups such as phase detection pixel group 100 shown in FIG. 2A. If desired, pixel groups that provide depth sensing capabilities may also provide high dynamic range functionalities.

FIG. 2A is an illustrative cross-sectional view of pixel group 100. In FIG. 2A, phase detection pixel group 100 is a pixel pair. Pixel pair 100 may include first and second pixels such Pixel 1 and Pixel 2. Pixel 1 and Pixel 2 may include photosensitive regions such as photosensitive regions 110 formed in a substrate such as silicon substrate 108. For example, Pixel 1 may include an associated photosensitive region such as photodiode PD1, and Pixel 2 may include an associated photosensitive region such as photodiode PD2. A microlens may be formed over photodiodes PD1 and PD2 and may be used to direct incident light towards photodiodes PD1 and PD2. The arrangement of FIG. 2A in which microlens 102 covers two pixel regions may sometimes be referred to as a 2×1 or 1×2 arrangement because there are two phase detection pixels arranged consecutively in a line. In an alternate embodiment, three phase detection pixels may be arranged consecutively in a line in what may sometimes be referred to as a 1×3 or 3×1 arrangement. In other embodiments, phase detection pixels may be grouped in a 2×2 or 2×4 arrangement. In general, phase detection pixels may be arranged in any desired manner.

Color filters such as color filter elements 104 may be interposed between microlens 102 and substrate 108. Color filter elements 104 may filter incident light by only allowing predetermined wavelengths to pass through color filter elements 104 (e.g., color filter 104 may only be transparent to the wavelengths corresponding to a green color, a red color, a blue color, a yellow color, a cyan color, a magenta color, visible light, infrared light, etc.). Color filter 104 may be a broadband color filter. Examples of broadband color filters include yellow color filters (e.g., yellow color filter material that passes red and green light) and clear color filters (e.g., transparent material that passes red, blue, and green light). In general, broadband filter elements may pass two or more colors of light. Photodiodes PD1 and PD2 may serve to absorb incident light focused by microlens 102 and produce pixel signals that correspond to the amount of incident light absorbed.

Photodiodes PD1 and PD2 may each cover approximately half of the substrate area under microlens 102 (as an example). By only covering half of the substrate area, each photosensitive region may be provided with an asymmetric angular response (e.g., photodiode PD1 may produce different image signals based on the angle at which incident light reaches pixel pair 100). The angle at which incident light reaches pixel pair 100 relative to a normal axis 116 (i.e., the angle at which incident light strikes microlens 102 relative to the optical axis 116 of lens 102) may be herein referred to as the incident angle or angle of incidence.

An image sensor can be formed using front side illumination imager arrangements (e.g., when circuitry such as metal interconnect circuitry is interposed between the microlens and photosensitive regions) or backside illumination imager arrangements (e.g., when photosensitive regions are interposed between the microlens and the metal interconnect circuitry). The example of FIGS. 2A, 2B, and 2C in which pixels 1 and 2 are backside illuminated image sensor pixels is merely illustrative. If desired, pixels 1 and 2 may be front side illuminated image sensor pixels. Arrangements in which pixels are backside illuminated image sensor pixels are sometimes described herein as an example.

In the example of FIG. 2B, incident light 113 may originate from the left of normal axis 116 and may reach pixel pair 100 with an angle 114 relative to normal axis 116. Angle 114 may be a negative angle of incident light. Incident light 113 that reaches microlens 102 at a negative angle such as angle 114 may be focused towards photodiode PD2. In this scenario, photodiode PD2 may produce relatively high image signals, whereas photodiode PD1 may produce relatively low image signals (e.g., because incident light 113 is not focused towards photodiode PD1).

Figure 2C:
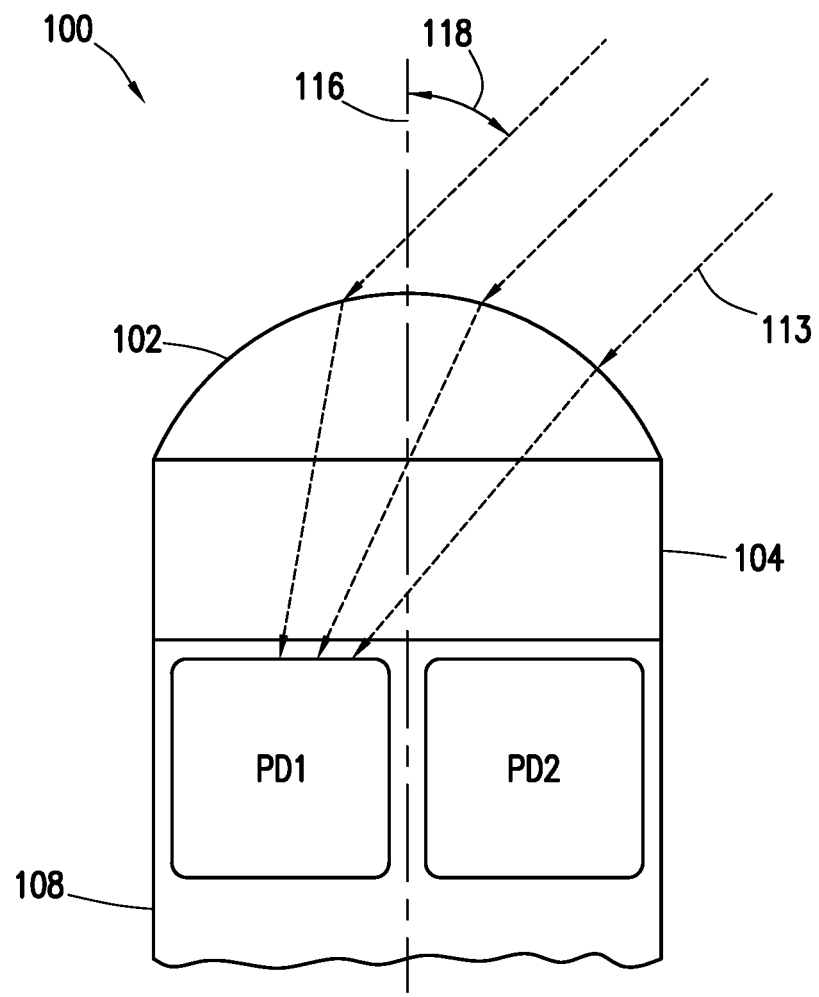

In the example of FIG. 2C, incident light 113 may originate from the right of normal axis 116 and reach pixel pair 100 with an angle 118 relative to normal axis 116. Angle 118 may be a positive angle of incident light. Incident light that reaches microlens 102 at a positive angle such as angle 118 may be focused towards photodiode PD1 (e.g., the light is not focused towards photodiode PD2). In this scenario, photodiode PD2 may produce an image signal output that is relatively low, whereas photodiode PD1 may produce an image signal output that is relatively high.

The positions of photodiodes PD1 and PD2 may sometimes be referred to as asymmetric or displaced positions because the center of each photosensitive area 110 is offset from (i.e., not aligned with) optical axis 116 of microlens 102. Due to the asymmetric formation of individual photodiodes PD1 and PD2 in substrate 108, each photosensitive area 110 may have an asymmetric angular response (e.g., the signal output produced by each photodiode 110 in response to incident light with a given intensity may vary based on an angle of incidence). It should be noted that the example of FIGS. 2A-2C where the photodiodes are adjacent is merely illustrative. If desired, the photodiodes may not be adjacent (i.e., the photodiodes may be separated by one or more intervening photodiodes). In the diagram of FIG. 3, an example of the image signal outputs of photodiodes PD1 and PD2 of pixel pair 100 in response to varying angles of incident light is shown.

Line 160 may represent the output image signal for photodiode PD2 whereas line 162 may represent the output image signal for photodiode PD1. For negative angles of incidence, the output image signal for photodiode PD2 may increase (e.g., because incident light is focused onto photodiode PD2) and the output image signal for photodiode PD1 may decrease (e.g., because incident light is focused away from photodiode PD1). For positive angles of incidence, the output image signal for photodiode PD2 may be relatively small and the output image signal for photodiode PD1 may be relatively large.

The size and location of photodiodes PD1 and PD2 of pixel pair 100 of FIGS. 2A, 2B, and 2C are merely illustrative. If desired, the edges of photodiodes PD1 and PD2 may be located at the center of pixel pair 100 or may be shifted slightly away from the center of pixel pair 100 in any direction. If desired, photodiodes 110 may be decreased in size to cover less than half of the pixel area.

Output signals from pixel pairs such as pixel pair 100 may be used to adjust the optics (e.g., one or more lenses such as lenses 28 of FIG. 1) in image sensor 14 during automatic focusing operations. The direction and magnitude of lens movement needed to bring an object of interest into focus may be determined based on the output signals from pixel pairs 100.

For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference can be used to determine the direction and magnitude of optics movement needed to bring the images into phase and thereby focus the object of interest. Pixel blocks that are used to determine phase difference information such as pixel pair 100 are sometimes referred to herein as phase detection pixels or depth-sensing pixels.

A phase difference signal may be calculated by comparing the output pixel signal of PD1 with that of PD2. For example, a phase difference signal for pixel pair 100 may be determined by subtracting the pixel signal output of PD1 from the pixel signal output of PD2 (e.g., by subtracting line 162 from line 160). For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another).

As previously mentioned, the example in FIGS. 2A-2C where phase detection pixel block 100 includes two adjacent pixels is merely illustrative. In another illustrative embodiment, phase detection pixel block 100 may include multiple adjacent pixels that are covered by varying types of microlenses.

Figure 4:
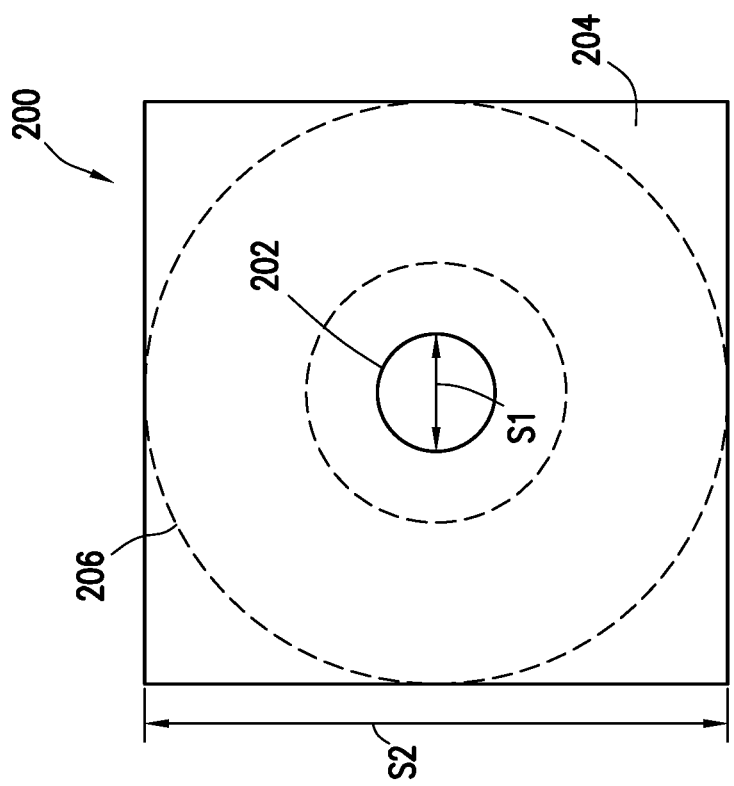
FIG. 4 is a top view of an illustrative pixel with an inner sub-pixel and an outer sub-pixel that is covered by a toroidal microlens in accordance with an embodiment of the present invention.

FIG. 4 is a top view of an illustrative pixel that may be included in an image sensor such as image sensor 14. As shown, pixel 200 has at least two different light collecting areas (LCAs). Pixel 200 may include photodiodes with associated pixel circuitry used to capture the same spectrum of light. As an example, the pixels 200 may be used to capture red, green, blue, cyan, magenta, yellow, near-infrared, infrared, or any other spectrum of light. A single red, green, blue, cyan, magenta, yellow, near-infrared, infrared, or clear color filter may be formed over the pixel 200. In certain embodiments, the color filter formed over pixel 200 may have areas that pass colored light and areas that are clear (i.e., that pass visible or full-spectrum light outside the visible spectrum).

Pixel 200 of FIG. 4 may include a first sub-pixel 202, which may be referred to as the inner sub-pixel 202. Inner sub-pixel 202 may be completely surrounded by a second sub-pixel 204, which may be referred to as the outer sub-pixel 204. Inner sub-pixel 202 and outer sub-pixel 204 may correspond to n-type doped photodiode regions in a semiconductor substrate. There may be respective sub-pixel circuitry in the substrate such as transfer gates, floating diffusion regions, and reset gates of the pixel 200 that is coupled to the photodiode regions in the sub-pixels 202 and 204. The semiconductor substrate (not shown) may be a bulk p-type substrate made of silicon, or any other suitable semiconductor material.

A photodiode in inner sub-pixel 202 may have a circular shape at the surface. In other words, the light collecting area of inner sub-pixel 202 is a circular region. At the surface, the inner sub-pixel 202 may have a diameter S1. As an example, the diameter S1 of a photodiode in inner sub-pixel 202 may be 1 micron, but may alternatively be any other dimension without departing from the scope of the present embodiment. Outer sub-pixel 204 may have a square outer boundary and a circular inner boundary at the surface. The area enclosed by the square outer boundary and circular inner boundary of outer sub-pixel 204 shown in FIG. 4 may correspond to the light collecting area of outer sub-pixel 204. As shown in FIG. 4, the length of one of the sides of outer sub-pixel 204 is S2. As an example, S2 may be 3 microns, but may alternatively be any other dimension without departing from the scope of the present embodiment. The length S2 is preferably greater than the length S1. Outer sub-pixel 204 is illustrated in FIG. 4 as having a square outer boundary but may alternatively have a rectangular outer boundary.

If desired an optional isolation region may be formed between inner sub-pixel 202 and outer sub-pixel 204. The isolation region may separate individual sub-pixels in a given pixel from one another, and may also separate individual sub-pixels in different respective pixels from one another. The optional isolation region may be formed from different types of isolation devices such as trench isolation structures, doped semiconductor regions, metallic barrier structures, or any other suitable isolation device.

Because inner sub-pixel 202 is surrounded by outer sub-pixel 204, inner sub-pixel 202 may sometimes be described as being nested within outer sub-pixel 204. Pixel 200 may sometimes be referred to as a nested image pixel. The inner sub-pixel group and the outer sub-pixel group in a nested image pixel may have the same geometric optical centers. In other words, because the outer sub-pixel group surrounds the inner sub-pixel group symmetrically, the center of the surface of the inner sub-pixel group is the same as the center of the outer sub-pixel group that surrounds the inner sub-pixel group.

The inner sub-pixel 202 may have a lower sensitivity to incident light, and may be referred to as having a lower sensitivity light collecting area compared to outer sub-pixel 204. The respective doping concentrations of inner sub-pixel 202 and outer sub-pixel 204 may be different or they may be the same. As an example, the doping concentrations of photodiode regions in inner sub-pixel 202 may be modified to reduce the sensitivity of inner sub-pixel 202 to light. However, for the sake of simplicity in explaining and highlighting the properties of the pixel 200, it will be assumed that the sub-pixels 202 and 204 have photodiodes with the same doping concentrations. The lower sensitivity to incident light of inner sub-pixel 202 compared to outer sub-pixel 204 may be a result of the lower light collecting area of inner sub-pixel 202 compared to the light collecting area of outer sub-pixel 204.

The ratio of the light sensitivity of the outer sub-pixel group to the light sensitivity of the inner sub-pixel group may be at least 4 to 1, but could be 5 to 1, 10 to 1, any intermediate ratio, or any larger ratio. In other words, the light sensitivity of the outer sub-pixel group may be at least four times greater than the light sensitivity of the inner sub-pixel group.

One or more microlenses may be formed over the pixel 200 of FIG. 4 to direct light toward the outer sub-pixel 204. The one or more microlenses may be formed over the color filter formed over pixel 200. To direct light toward outer sub-pixel 204, the one or more microlenses may be formed over only outer sub-pixel 204. As shown in FIG. 4, microlens 206 is a toroidal microlens that covers outer sub-pixel 204. The toroidal microlens has an opening that overlaps inner sub-pixel 202 such that the microlens does not overlap inner sub-pixel 202. This enables light to be directed towards the outer sub-pixel. In some embodiments however, the one or more microlenses that direct light toward outer sub-pixel 204 may partially or completely overlap the light collecting area of sub-pixel 202. Directing light toward outer sub-pixel 204 may further increase the sensitivity of the light collecting area of outer sub-pixel 204 relative to the sensitivity of the light collecting area of inner sub-pixel 202. In some embodiments, inner sub-pixel 202 may optionally be covered by a microlens that is formed separately from microlens 206.

Because a larger amount of light incident on pixel 200 is directed to outer sub-pixel 204 than to inner sub-pixel 202, inner sub-pixel 202 is said to have a lower sensitivity light collecting area compared to outer sub-pixel 204. The difference in sensitivity to light of inner sub-pixel 202 and outer sub-pixel 204 enables pixel 200 to be used in high dynamic range applications while using the same integration time for each sub-pixel. If desired, the integration time for each sub-pixel may be different to further increase the dynamic range of the pixel.

Figure 5:
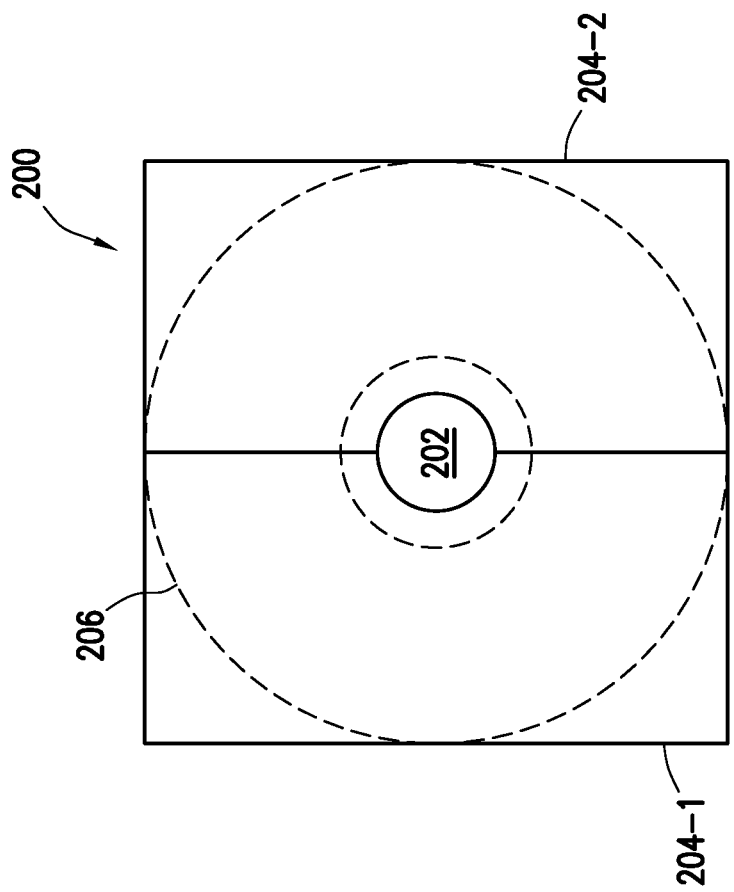
FIG. 5 is a top view of an illustrative pixel with an inner sub-pixel and a split outer sub-pixel group that is covered by a toroidal microlens in accordance with an embodiment of the present invention.

It may be desirable to provide phase detection capabilities in a pixel of the type shown in FIG. 4. FIG. 5 shows an illustrative imaging pixel with high dynamic range functionality and phase detection capability. As shown in FIG. 5, pixel 200 may include an inner sub-pixel 202. Additionally, pixel 200 may include two outer sub-pixels 204-1 and 204-2. Sub-pixels 204-1 and 204-2 may sometimes collectively be referred to as outer sub-pixel group 204. By splitting the outer sub-pixel group 204 into two separate outer sub-pixels, the outer sub-pixel group may have phase detection capabilities (e.g., sub-pixels 204-1 and 204-2 may each have an asymmetric response to incident light). In FIGS. 4 and 5, toroidal microlens 206 is shown as not overlapping inner sub-pixel 202. This example is merely illustrative. If desired, toroidal microlens 206 may partially overlap inner sub-pixel 202. The microlens may divert light away from inner sub-pixel 202 towards outer sub-pixel group 204.

Figure 7:
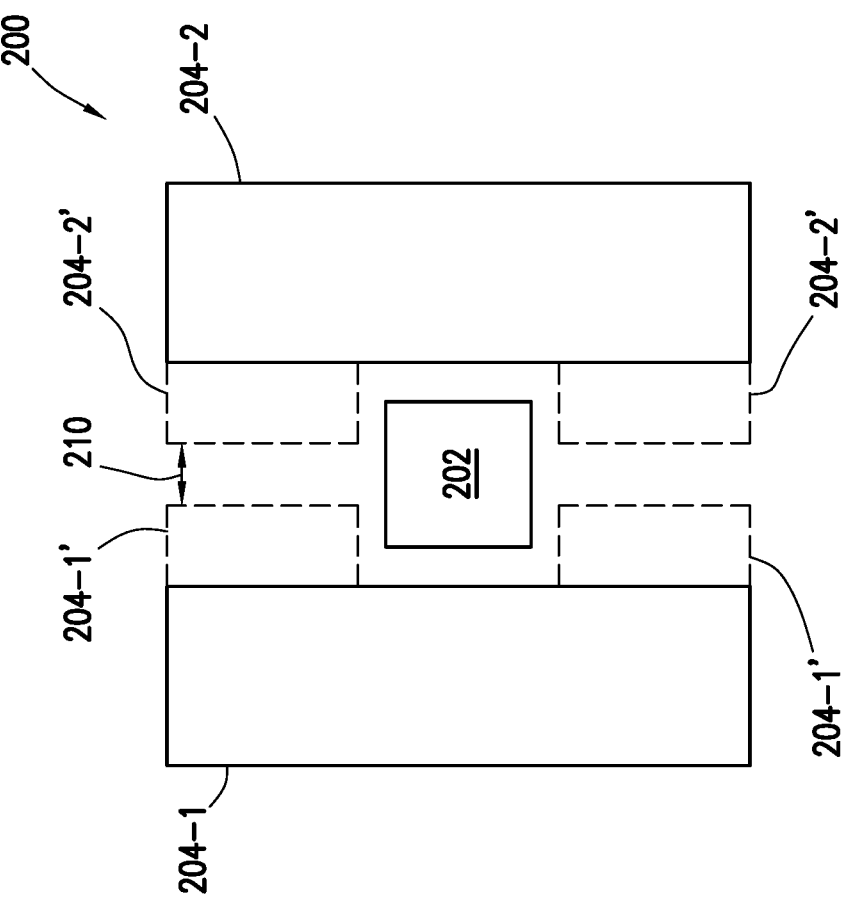
FIG. 7 is a cross-sectional top view of the backside of the illustrative pixel of FIG. 6 in accordance with an embodiment of the present invention.
Figure 6:
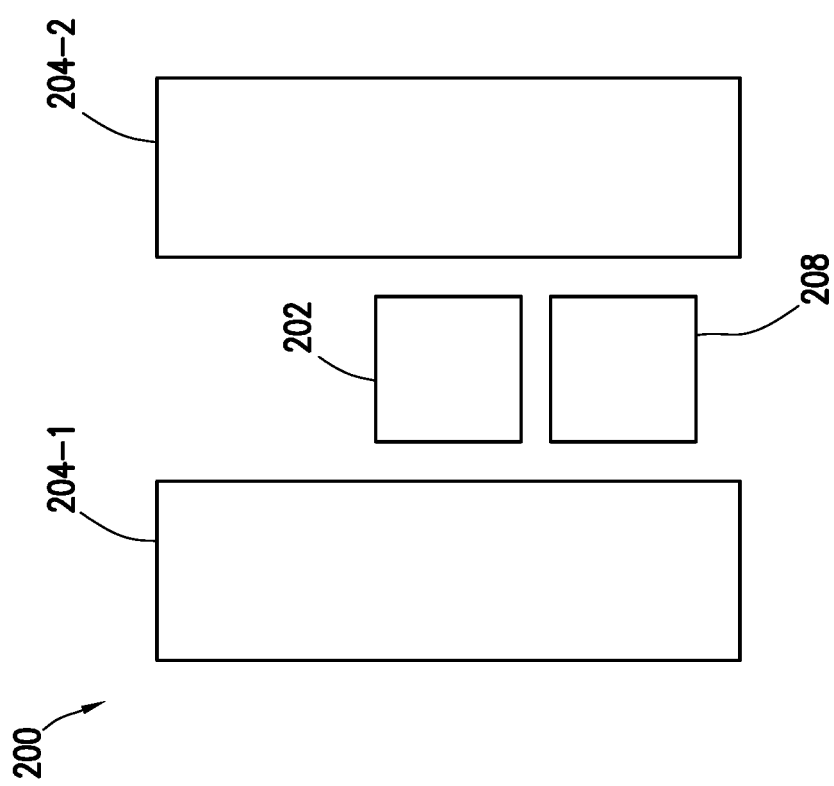
FIG. 6 is a cross-sectional bottom view of the front side of an illustrative pixel with an inner sub-pixel and a split outer sub-pixel group in accordance with an embodiment of the present invention.

FIG. 6 shows a cross-sectional bottom view of the front side of an illustrative imaging pixel with an outer sub-pixel group containing two sub-pixels. FIG. 7 shows a cross-sectional top view of the backside of the imaging pixel shown in FIG. 6. As shown in FIG. 6, at the front side of the pixel (i.e., the side on which the pixel's processing circuitry is formed) first and second outer sub-pixels 204-1 and 204-2 may have a rectangular shape. Inner sub-pixel 202 may be formed between outer sub-pixels 204-1 and 204-2. Additionally, a floating diffusion region 208 may be formed between outer sub-pixels 204-1 and 204-2. Floating diffusion region 208 may be configured to receive charge transferred from one or more of inner sub-pixel 202, outer sub-pixel 204-1, and outer sub-pixel 204-2. As shown in FIG. 7, at the backside of the pixel (i.e., the side that is exposed to incident light) the outer sub-pixels may have outer sub-pixel extensions. Outer sub-pixel 204-1 may have outer sub-pixel extensions 204-1', while outer sub-pixel 204-2 may have outer sub-pixel extensions 204-2'. The outer sub-pixel extensions may help maximize the light collecting area at the backside of the imaging pixel. The outer sub-pixel extensions 204-1' may be separated from outer sub-pixel extensions 204-2' by a distance 210. This distance may be any desired distance (e.g., less than 1 micron, less than 0.1 micron, less than 0.01 micron, greater than 0.01 micron, greater than 0.1 micron, etc.).

Figure 8:
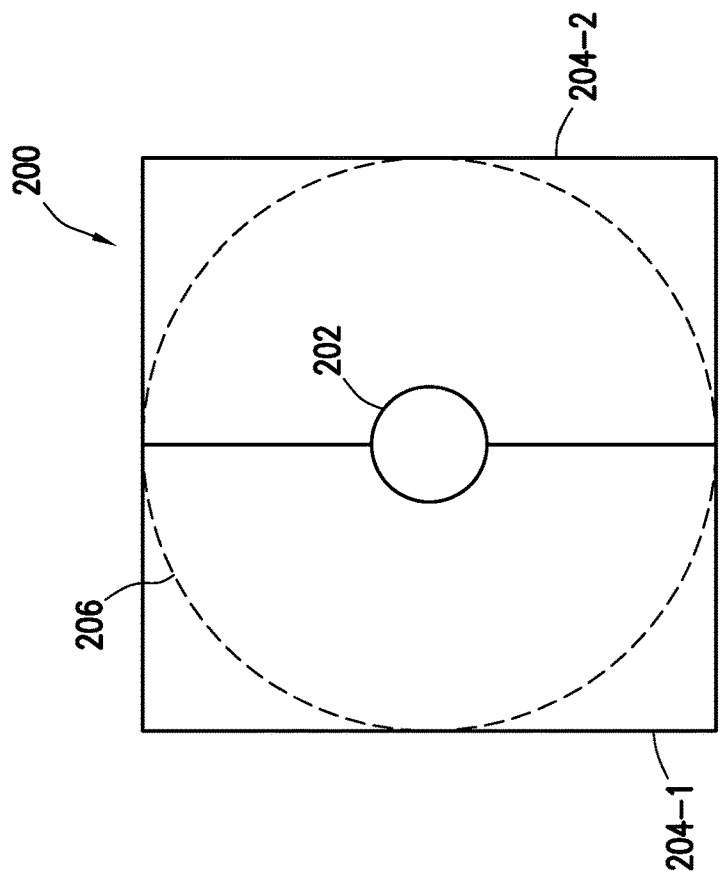
FIG. 8 is a top view of an illustrative pixel with an inner sub-pixel and a split outer sub-pixel group that is covered by a circular microlens in accordance with an embodiment of the present invention.

In FIGS. 4 and 5, a microlens arrangement was shown where a single toroidal microlens covers pixel 200. This example is merely illustrative, and any desired microlens arrangement may be used to cover pixel 200. For example, FIG. 8 shows an embodiment where a single circular microlens covers pixel 200. Microlens 206 may cover both inner sub-pixel 202 and outer sub-pixel group 204. Microlens 206 in FIG. 8 may not have any openings (as opposed to the microlens in FIGS. 4 and 5). Microlens 206 in FIG. 8 may sometimes be referred to as a monocular microlens.

Figure 9:
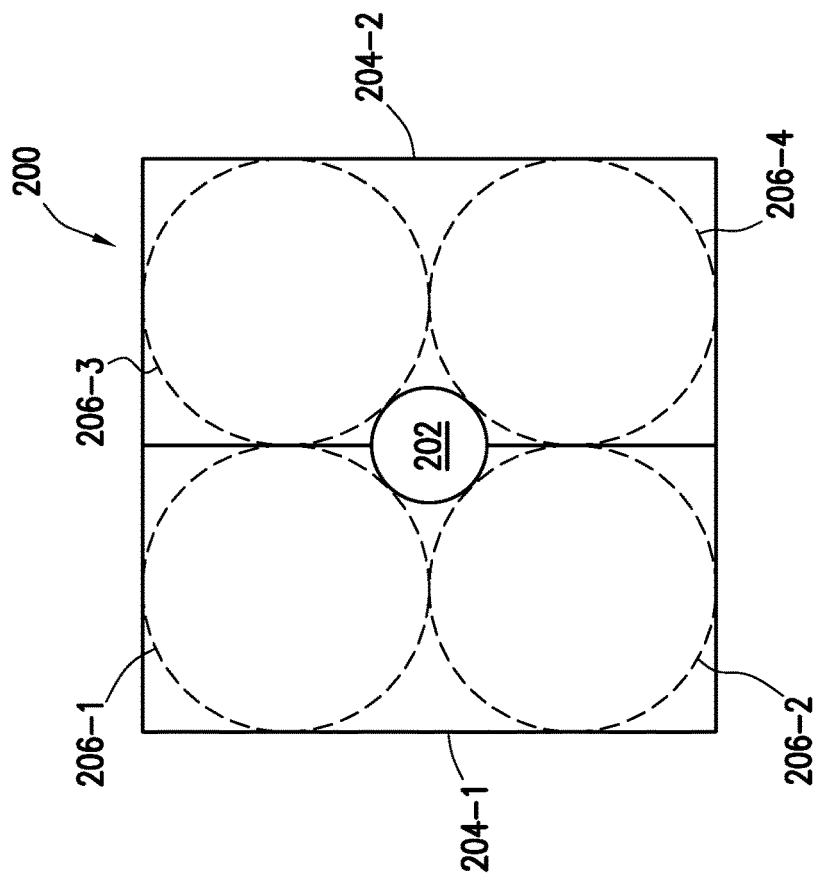
FIG. 9 is a top view of an illustrative pixel with an inner sub-pixel and a split outer sub-pixel group that is covered by four circular microlenses in accordance with an embodiment of the present invention.

In another illustrative embodiment shown in FIG. 9, pixel 200 may be covered by four circular microlenses. Microlenses 206-1 and 206-2 may cover portions of outer sub-pixel 204-1. Microlenses 206-3 and 206-4 may cover portions of outer sub-pixel 204-2. In FIG. 9, microlenses 206-1, 206-2, 206-3, and 206-4 are shown as not overlapping inner sub-pixel 202. This example is merely illustrative. If desired, microlenses 206-1, 206-2, 206-3, and 206-4 may partially overlap inner sub-pixel 202. The microlenses may divert light away from inner sub-pixel 202 towards outer sub-pixels 204-1 and 204-2.

In yet another illustrative embodiment, pixel 200 may be covered by two elliptical microlenses. An arrangement of this type is shown in FIG. 10. As shown in FIG. 10, a first elliptical microlens 206-1 may cover portions of both outer sub-pixel 204-1 and outer sub-pixel 204-2. A second elliptical microlens 206-2 may also cover portions of outer sub-pixel 204-1 and outer sub-pixel 204-2. In FIG. 10, microlenses 206-1 and 206-2 are shown as partially overlapping inner sub-pixel 202. This example is merely illustrative. If desired, microlenses 206-1 and 206-2 may not overlap inner sub-pixel 202.

In FIGS. 5-10, outer sub-pixel group 204 is shown as being split such that sub-pixels 204-1 and 204-2 are horizontally oriented (i.e., the outer sub-pixel group is split with a vertical divide such that sub-pixels 204-1 and 204-2 are horizontally adjacent). The horizontal orientation of sub-pixels 204-1 and 204-2 may enable the pixel to detect vertical edges in a scene. The example of outer sub-pixel group 204 being split so that sub-pixels 204-1 and 204-2 are horizontally adjacent is merely illustrative. If desired, outer sub-pixel group 204 may be split so that sub-pixels 204-1 and 204-2 are vertically adjacent. An arrangement of this type is shown in FIG. 11. As shown, pixel 200 may have an inner sub-pixel 202 similar to those shown in FIGS. 5-10. Pixel 200 may also have an outer sub-pixel group 204. However, in FIG. 11 the outer sub-pixel group may be split such that outer sub-pixel 204-1 is vertically adjacent to outer sub-pixel 204-2. The vertical orientation of sub-pixels 204-1 and 204-2 in FIG. 11 may enable the pixel to detect horizontal edges in a scene.

Figure 12:
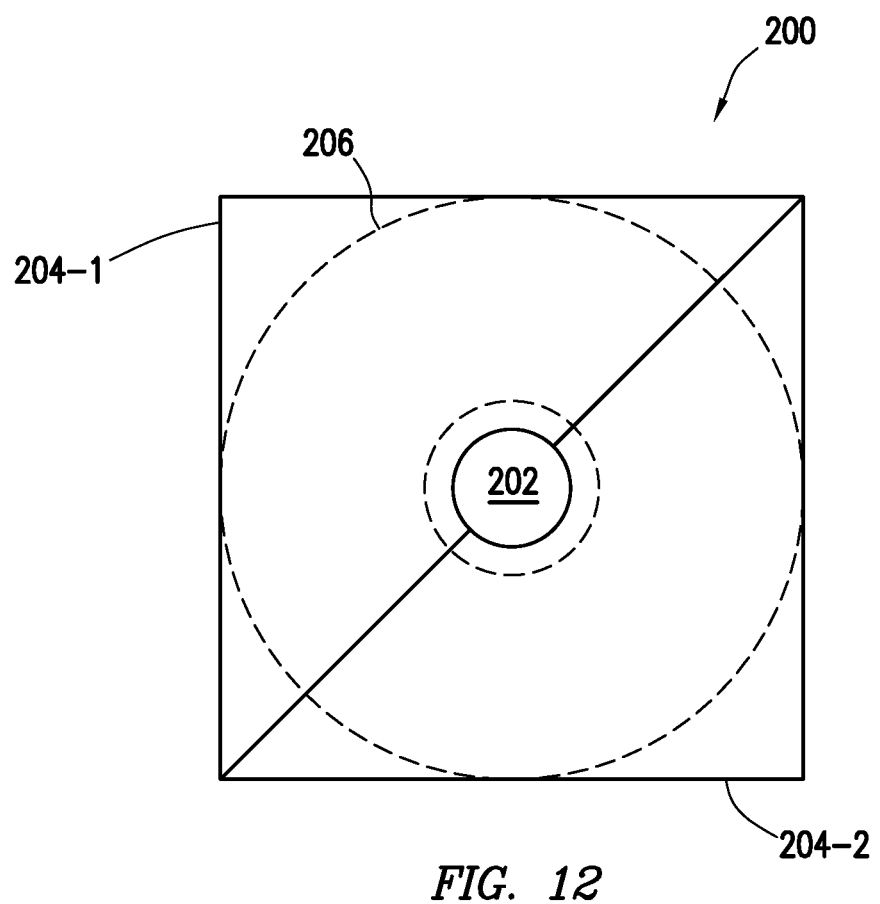
FIG. 12 is a top view of an illustrative pixel with an inner sub-pixel and a diagonally split outer sub-pixel group that is covered by a toroidal microlens in accordance with an embodiment of the present invention.

In yet another embodiment, outer sub-pixel group 204 may be split diagonally, as shown in FIG. 12. Splitting outer sub-pixel group 204 diagonally may result in sub-pixels 204-1 and 204-2 as shown in FIG. 12. Pixel 200 in FIG. 12 may be suited to detecting diagonal edges in a scene. In general, outer sub-pixel group 204 may be split in any desired manner.

Figure 13:
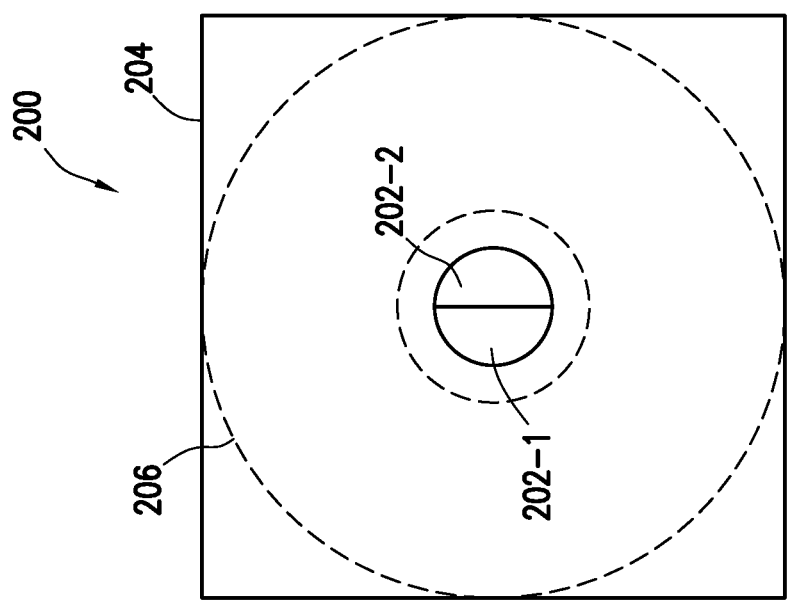
FIG. 13 is a top view of an illustrative pixel with a split inner sub-pixel group and an outer sub-pixel that is covered by a toroidal microlens in accordance with an embodiment of the present invention.

In FIGS. 4-12, inner sub-pixel 202 is shown as being a single light collecting area. However, it may be desirable to provide the inner sub-pixel with phase detection capabilities. FIG. 13 shows an illustrative imaging pixel with high dynamic range functionality and phase detection capability. As shown in FIG. 13, pixel 200 may include an outer sub-pixel 204. Outer sub-pixel 204 may enclose an inner sub-pixel group 202. Inner sub-pixel group 202 may be split into inner sub-pixel 202-1 and inner sub-pixel 202-2. By splitting the inner sub-pixel group 202 into two separate inner sub-pixels, the inner sub-pixel group may have phase detection capabilities. Inner sub-pixel group 202 may be split to form horizontally adjacent inner sub-pixels (as shown in FIG. 13) or may be split to form vertically adjacent inner sub-pixels. Inner sub-pixel group 202 may also be split diagonally. FIG. 13 shows a toroidal microlens that covers outer sub-pixel 204 without covering inner sub-pixel 202. This example is merely illustrative, and other microlens arrangements may be used if desired. For example, if desired pixel 200 may include a toroidal microlens that covers outer sub-pixel group 204 and a circular microlens that covers inner sub-pixel group 202. In another illustrative embodiment, a single circular microlens may cover both outer sub-pixel group 204 and inner sub-pixel group 202.

Figure 14:
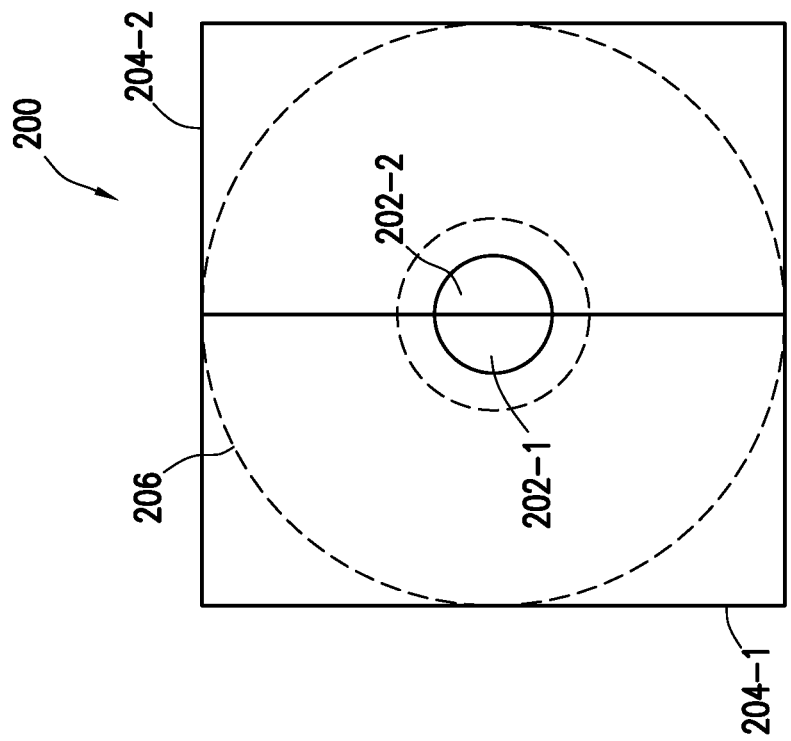
FIG. 14 is a top view of an illustrative pixel with a split inner sub-pixel group and a split outer sub-pixel group that is covered by a toroidal microlens in accordance with an embodiment of the present invention.

In certain embodiments, both inner sub-pixel group 202 and outer sub-pixel group 204 may be split to provide phase detection capabilities. An arrangement of this type is shown in FIG. 14. As shown, outer sub-pixel group 204 is split such that outer sub-pixel 204-1 and outer sub-pixel 204-2 are horizontally adjacent. Similarly, inner sub-pixel group 202 is split such that inner sub-pixel 202-1 and inner sub-pixel 202-2 are horizontally adjacent. Pixel 200 will therefore be able to obtain phase detection data from sub-pixels 202-1 and 202-2 as well as sub-pixels 204-1 and 204-2.

Figure 15:
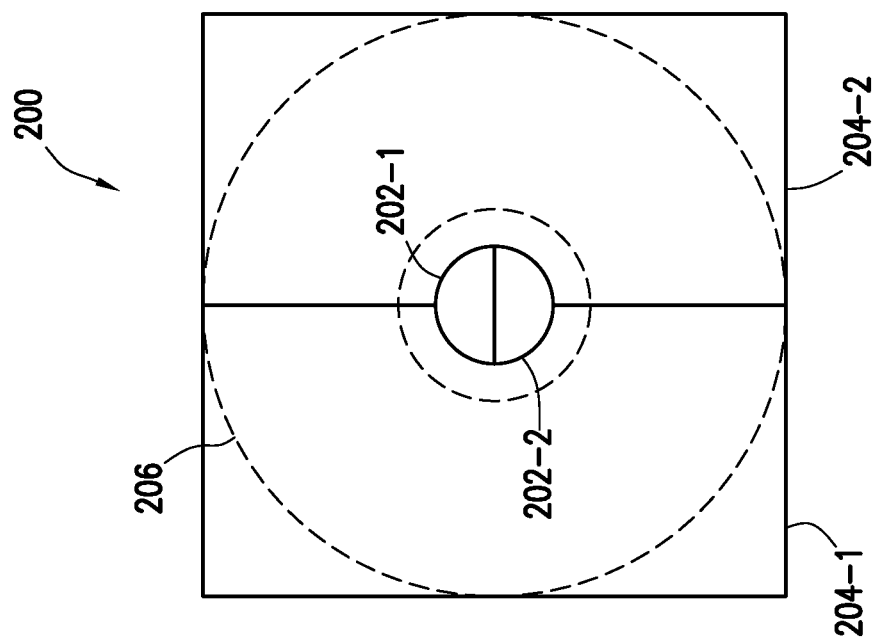
FIG. 15 is a top view of an illustrative pixel with a split inner sub-pixel group and a split outer sub-pixel group that is split in a different orientation than the inner sub-pixel group in accordance with an embodiment of the present invention.

The example of FIG. 14 where inner sub-pixel group 202 and outer sub-pixel group 204 are both split in the same orientation is merely illustrative. If desired, inner sub-pixel group 202 and outer sub-pixel group 204 may be split in separate orientations to provide phase detection data for multiple directions. As shown in FIG. 15, outer sub-pixel group 204 is split such that outer sub-pixel 204-1 and outer sub-pixel 204-2 are horizontally adjacent. However, inner sub-pixel group 202 is split such that inner sub-pixel 202-1 and inner sub-pixel 202-2 are vertically adjacent. This enables the pixel of FIG. 15 to detect both vertical and horizontal edges (while the pixel of FIG. 14 may be used to detect only vertical edges).

Figure 16:
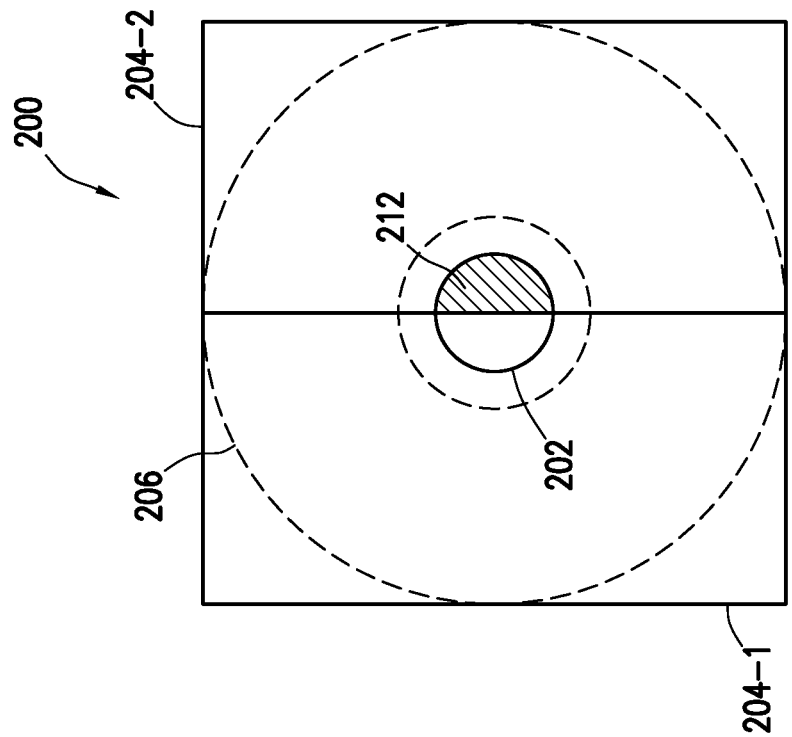
FIG. 16 is a top view of an illustrative pixel with a split outer sub-pixel group and an inner sub-pixel that is partially covered by a shielding layer in accordance with an embodiment of the present invention.

Instead of splitting inner sub-pixel group 202 into two separate sub-pixels to enable phase detection capabilities, a portion of inner sub-pixel group 202 may instead be covered by a shielding layer. As shown in FIG. 16, half of inner sub-pixel 202 may be covered by shielding layer 212. Shielding layer 212 may formed from metal or another material that is opaque to incident light. The uncovered portion of inner sub-pixel 202 will have an asymmetric angular response to incident light, enabling pixel 200 of FIG. 16 to be used in phase detection applications.

It should be understood that the previous examples of pixels shown in FIGS. 4-16 are merely illustrative, and that the concepts shown can be combined in any desired combination. For example, a number of microlens arrangements have been described (e.g., a single circular microlens, a single toroidal microlens, two elliptical microlenses, four circular microlenses, etc.). A number of arrangements for an outer sub-pixel group have been described (e.g., a single outer sub-pixel, an outer sub-pixel group that is split horizontally, an outer sub-pixel group that is split vertically, an outer sub-pixel group that is split diagonally, etc.). A number of arrangements for an inner sub-pixel group have been described (e.g., a single inner sub-pixel, an inner sub-pixel group that is split horizontally, an inner sub-pixel group that is split vertically, an inner sub-pixel group that is split diagonally, an inner sub-pixel that is partially covered by a shielding layer, etc.). Any desired microlens arrangement, inner sub-pixel arrangement, and outer sub-pixel arrangement may be used depending on the specific design considerations of the pixel.

Pixels such as those shown FIGS. 4-16 may be arranged in a pixel array in image sensor 14. Each pixel may have a corresponding color filter element that covers the inner sub-pixels and outer sub-pixels for that pixel. The color filter elements may be part of a color filter array. The pattern of color filters in the pixel array may be a Bayer mosaic pattern which includes a repeating unit cell of two-by-two pixels having two green image pixels arranged on one diagonal and one red and one blue image pixel arranged on the other diagonal. This example is merely illustrative, and other color filter patterns may be used if desired. For example, a broadband color filter (e.g., a yellow or clear color filter) may be used instead of a green color filter in the color filter array.

A number of other color filter patterns may be used if desired. For example, a monochrome pattern may be used. A color filter pattern with infrared or near-infrared filter elements may be used. In yet another illustrative embodiment, a color filter pattern with red and clear color filter elements (e.g., RCCC) or a color filter pattern with red, green, and clear color filter elements (e.g., RCCG) may be used. Additionally, the aforementioned example of the color filter pattern having a repeating unit cell of two-by-two pixels is merely illustrative. The color filter pattern may have a repeating unit cell of any desired size or shape (e.g., three-by-three, four-by-four, two-by-four, etc.).

Just as the color filter pattern includes a unit cell of two-by-two pixels that is repeated across the pixel array, the structure of the pixels may match the pattern of a unit cell that is repeated across the array. In other words, different pixels in the pixel array may have different structure. This may help optimize the dynamic range and phase detection performance of the image sensor.

Figure 17:
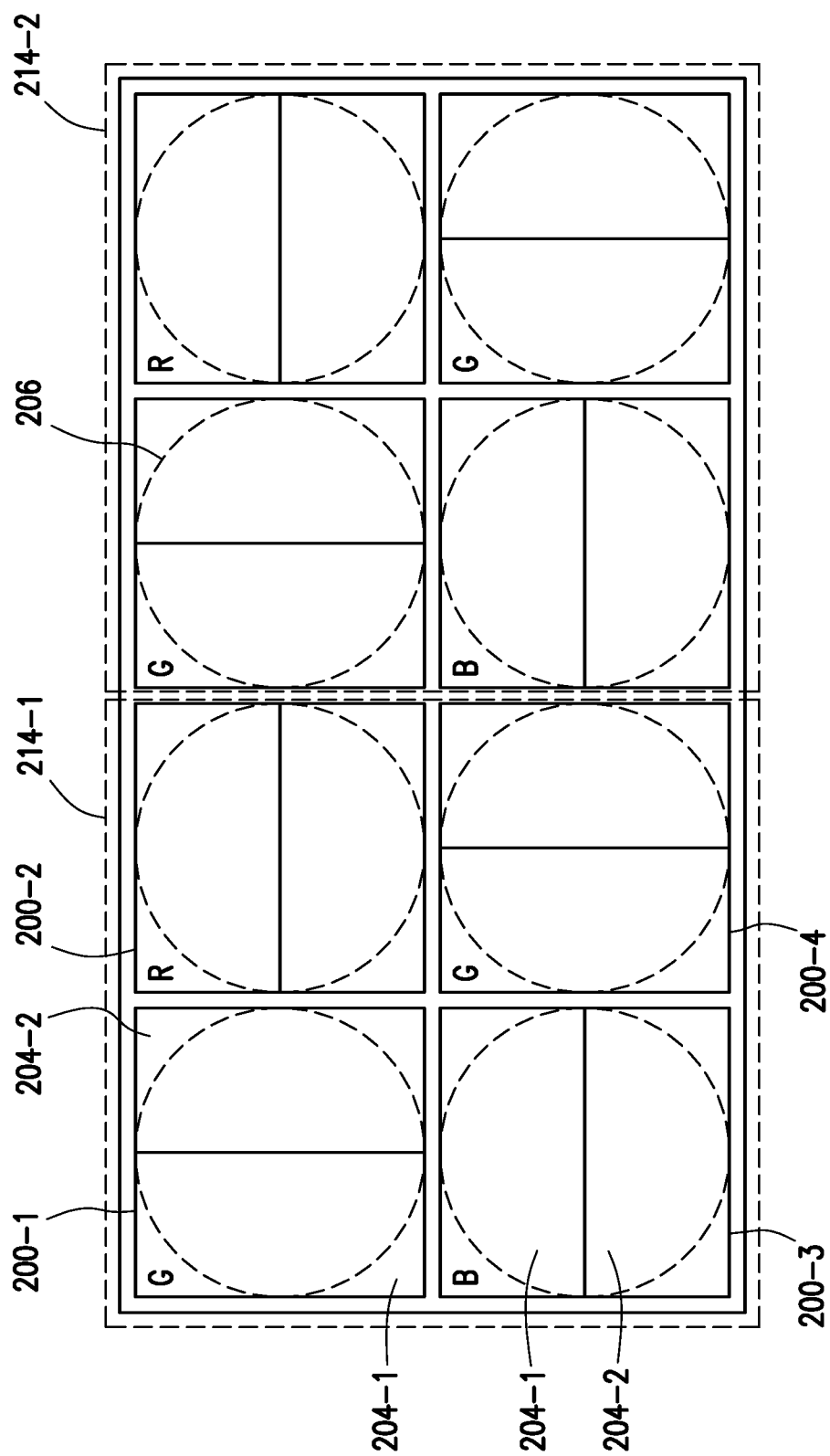
FIG. 17 is a top view of illustrative pixels with two sub-pixels arranged in a 2×2 repeating unit cell in accordance with an embodiment of the present invention.

An exemplary pattern of pixels is shown in FIG. 17. Pixels marked with an R include a red color filter, pixels marked with a G include a green color filter, and pixels marked with a B include a blue color filter. FIG. 17 (and subsequent FIGS. 18-24) show a Bayer color filter pattern. However, any desired color filter pattern may be used in the pixel array. As shown in FIG. 17, repeating unit cell 214-1 may include four pixels in a two-by-two arrangement. Pixels 200-1, 200-2, 200-3, and 200-4 may be included in repeating unit cell 214-1. Each pixel in repeating unit cell 214-1 may include two separate sub-pixels 204-1 and 204-2. The sub-pixels may enable the image sensor to gather phase detection data. The orientation of the sub-pixels may be varied in different pixels in the unit cell. As shown in FIG. 17, pixels 200-1 and 200-4 (the upper left and lower right pixels, respectively) may both be horizontally oriented while pixels 200-2 and 200-3 (the upper right and lower left pixels, respectively), may both be vertically oriented. By varying the orientation of pixels within the unit cell, the unit cell is able to gather multiple directions of phase detection data. Unit cell 214-1 may be repeated across the entire pixel array. As shown, the adjacent 2×2 group of pixels 214-2 is identical to the unit cell 214-1.

Figure 18:
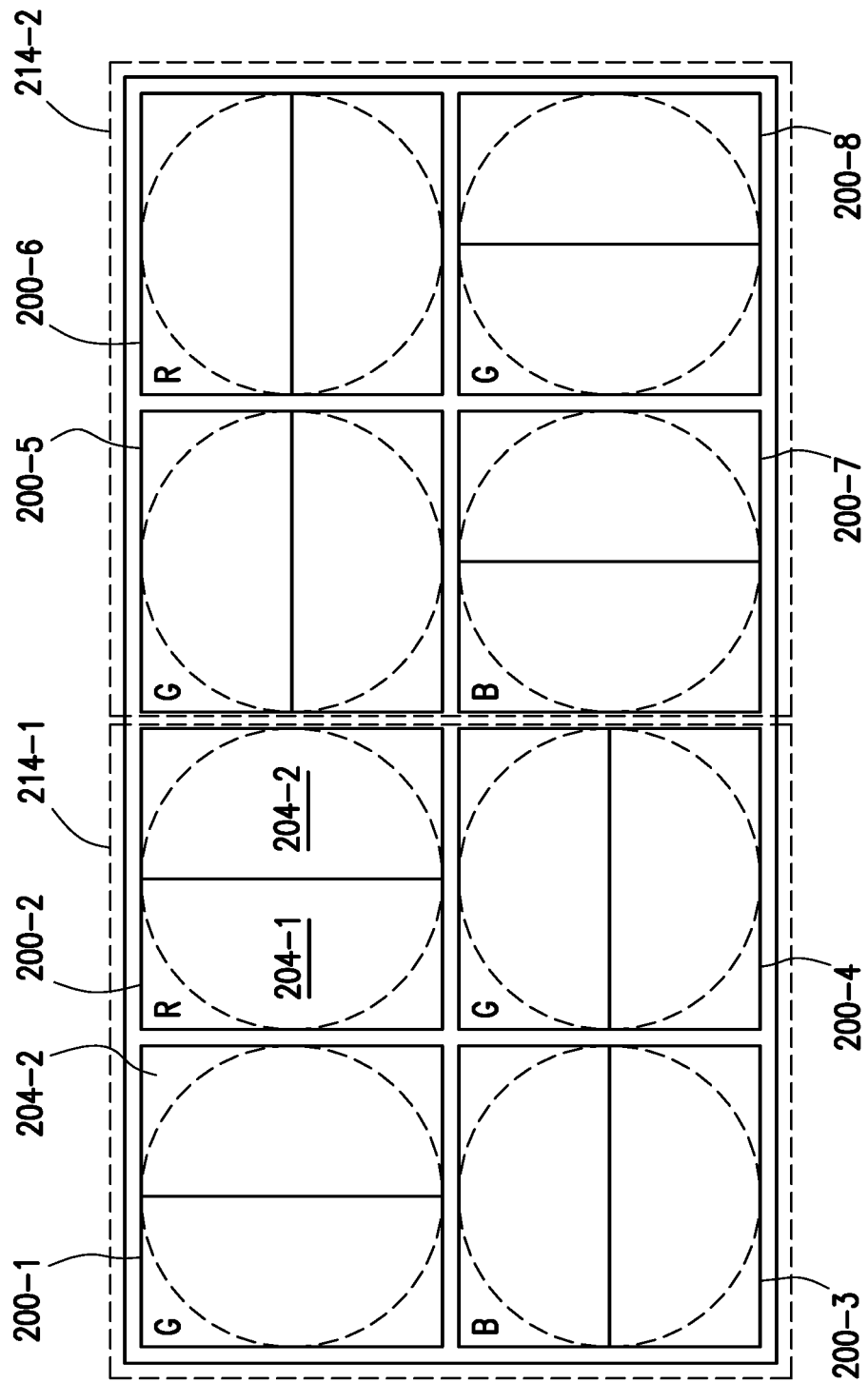
FIG. 18 is a top view of illustrative pixels with two sub-pixels arranged in a 2×4 repeating unit cell in accordance with an embodiment of the present invention.

FIG. 18 shows another exemplary pattern of pixels. As shown in FIG. 18, repeating unit cell 214-1 may include four pixels in a two-by-two arrangement. Pixels 200-1, 200-2, 200-3, and 200-4 may be included in repeating unit cell 214-1. Each pixel in repeating unit cell 214-1 may include two separate sub-pixels 204-1 and 204-2. The sub-pixels may enable the image sensor to gather phase detection data. The orientation of the sub-pixels may be varied in different pixels in the unit cell. As shown in FIG. 18, pixels 200-1 and 200-2 (the upper left and upper right pixels, respectively) may both be horizontally oriented while pixels 200-3 and 200-4 (the lower left and lower right pixels, respectively) may both be vertically oriented. By varying the orientation of pixels within the unit cell, the unit cell is able to gather multiple directions of phase detection data. The unit cell 214-2 adjacent to unit cell 214-1 may be identical to unit cell 214-1 except the orientation of the sub-pixels may be reversed. In other words, pixels that are horizontally oriented in unit cell 214-1 are vertically oriented in unit cell 214-2 and pixels that are vertically oriented in unit cell 214-1 are horizontally oriented in unit cell 214-2. For example, horizontally oriented pixel 200-1 in unit cell 214-1 becomes vertically oriented pixel 200-5 in unit cell 214-2, while vertically oriented pixel 200-3 in unit cell 214-1 becomes horizontally oriented pixel 200-7 in unit cell 214-2. Unit cells 214-1 and 214-2 may collectively be referred to as a 2×4 unit cell 214. The 2×4 unit cell 214 may be repeated across the entire pixel array.

Unit cell 214-2 may be described as having pixels with orientations that are the opposite of the orientation of the pixels in unit cell 214-1. Said another way, the pixels of unit cell 214-2 may be the same as the pixels of unit cell 214-1 except rotated 90 degrees.

Using the 2×4 unit cell 214 shown in FIG. 18 may have the advantage of being able to detect vertical and horizontal edges in each color channel. For example, the data from the unit cell of FIG. 18 enables detection of horizontal and vertical green edges, horizontal and vertical blue edges, and horizontal and vertical red edges. In comparison, the arrangement of FIG. 17 may only enable detection of vertical green edges, horizontal blue edges, and horizontal red edges.

FIGS. 17 and 18 show each pixel having a single circular microlens 206. However, this example is merely illustrative and each pixel may have any desired microlens arrangement. Each pixel in the pixel array may have the same microlens arrangement (as shown in FIGS. 17 and 18) or different pixels in the pixel array may have different microlens arrangements.

Figure 19:
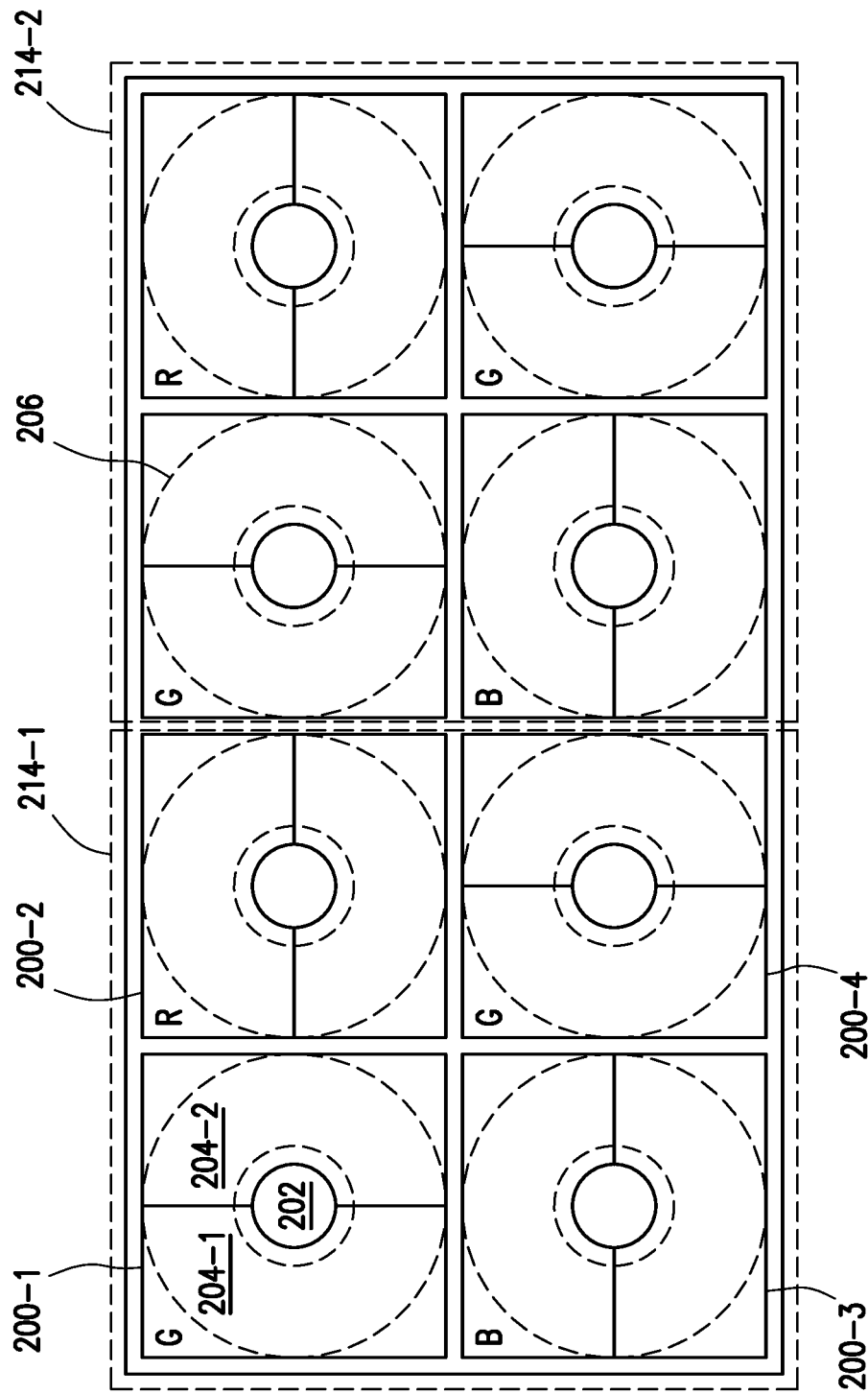
FIG. 19 is a top view of illustrative pixels with an outer sub-pixel group that surrounds an inner sub-pixel that are arranged in a 2×2 repeating unit cell in accordance with an embodiment of the present invention.

FIG. 19 shows another exemplary pattern of pixels where each pixel has an outer sub-pixel group and an inner sub-pixel group. As shown in FIG. 19, repeating unit cell 214-1 may include four pixels in a two-by-two arrangement. Pixels 200-1, 200-2, 200-3, and 200-4 may be included in repeating unit cell 214-1. Each pixel in repeating unit cell 214-1 may include outer sub-pixels 204-1 and 204-2 that surround inner sub-pixel 202. The sub-pixels may enable the image sensor to gather phase detection data and have a high dynamic range. The orientation of the sub-pixels may be varied in different pixels in the unit cell. As shown in FIG. 19, pixels 200-1 and 200-4 (the upper left and lower right pixels, respectively) may both be horizontally oriented while pixels 200-2 and 200-3 (the upper right and lower left pixels, respectively) may both be vertically oriented. By varying the orientation of pixels within the unit cell, the unit cell is able to gather multiple directions of phase detection data. Unit cell 214-1 may be repeated across the entire pixel array. As shown, the adjacent 2×2 group of pixels 214-2 is identical to the unit cell 214-1.

Figure 20:
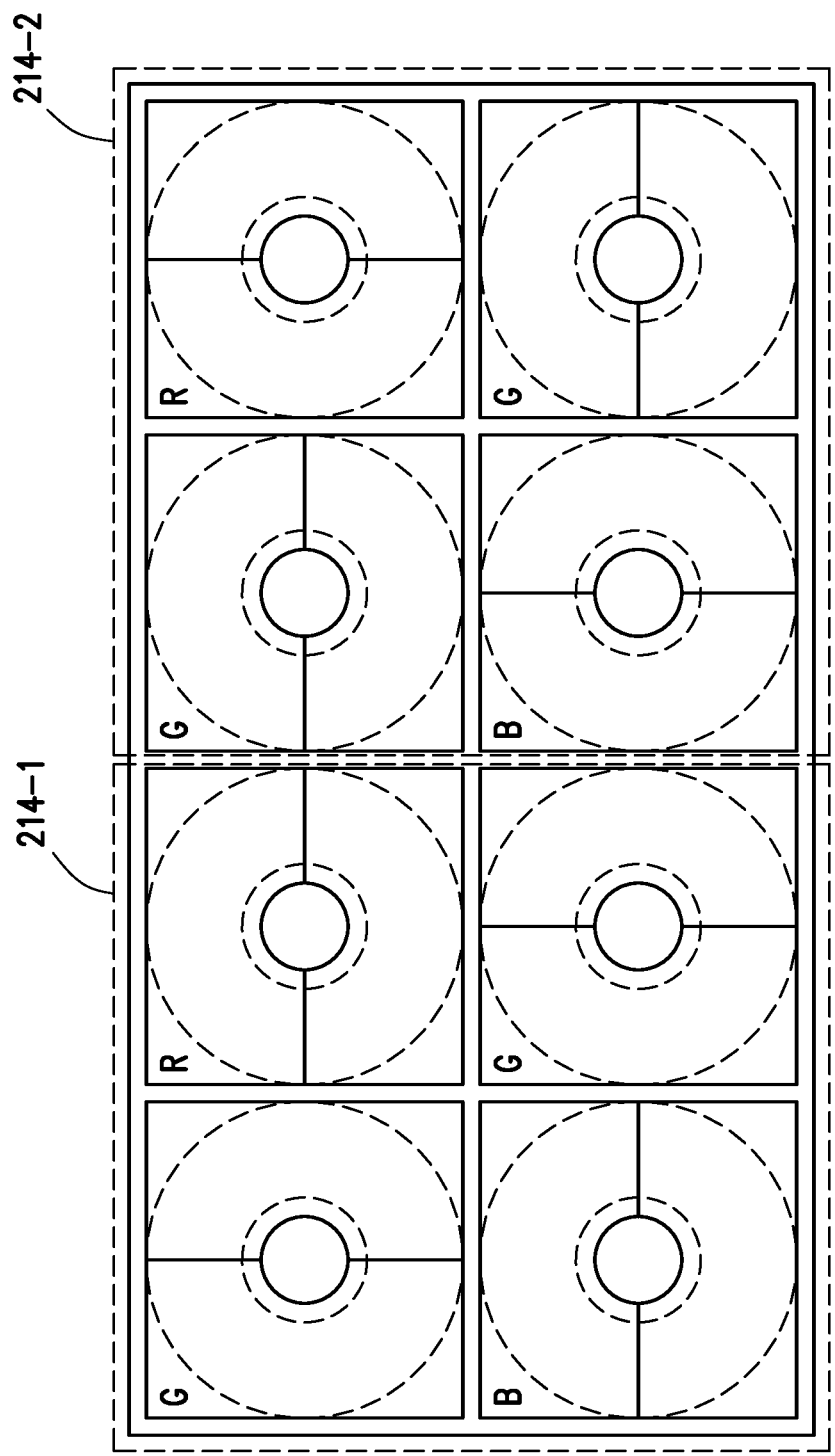
FIG. 20 is a top view of illustrative pixels with an outer sub-pixel group that surrounds an inner sub-pixel that are arranged in a 2×4 repeating unit cell in accordance with an embodiment of the present invention.

FIG. 20 shows an exemplary pattern of pixels similar to the pattern shown in FIG. 19. Unit cell 214-1 in FIG. 20 may be identical to unit cell 214-1 in FIG. 19. However, the orientation of the sub-pixels in unit cell 214-2 in FIG. 20 may be reversed when compared to unit cell 214-1 in FIG. 20 (similar to the change in orientation between unit cells 214-1 and 214-2 described in connection with FIG. 18). Unit cells 214-1 and 214-2 in FIG. 20 may collectively be referred to as a 2×4 unit cell 214. The 2×4 unit cell 214 in FIG. 20 may be repeated across the entire pixel array.

Figure 21:
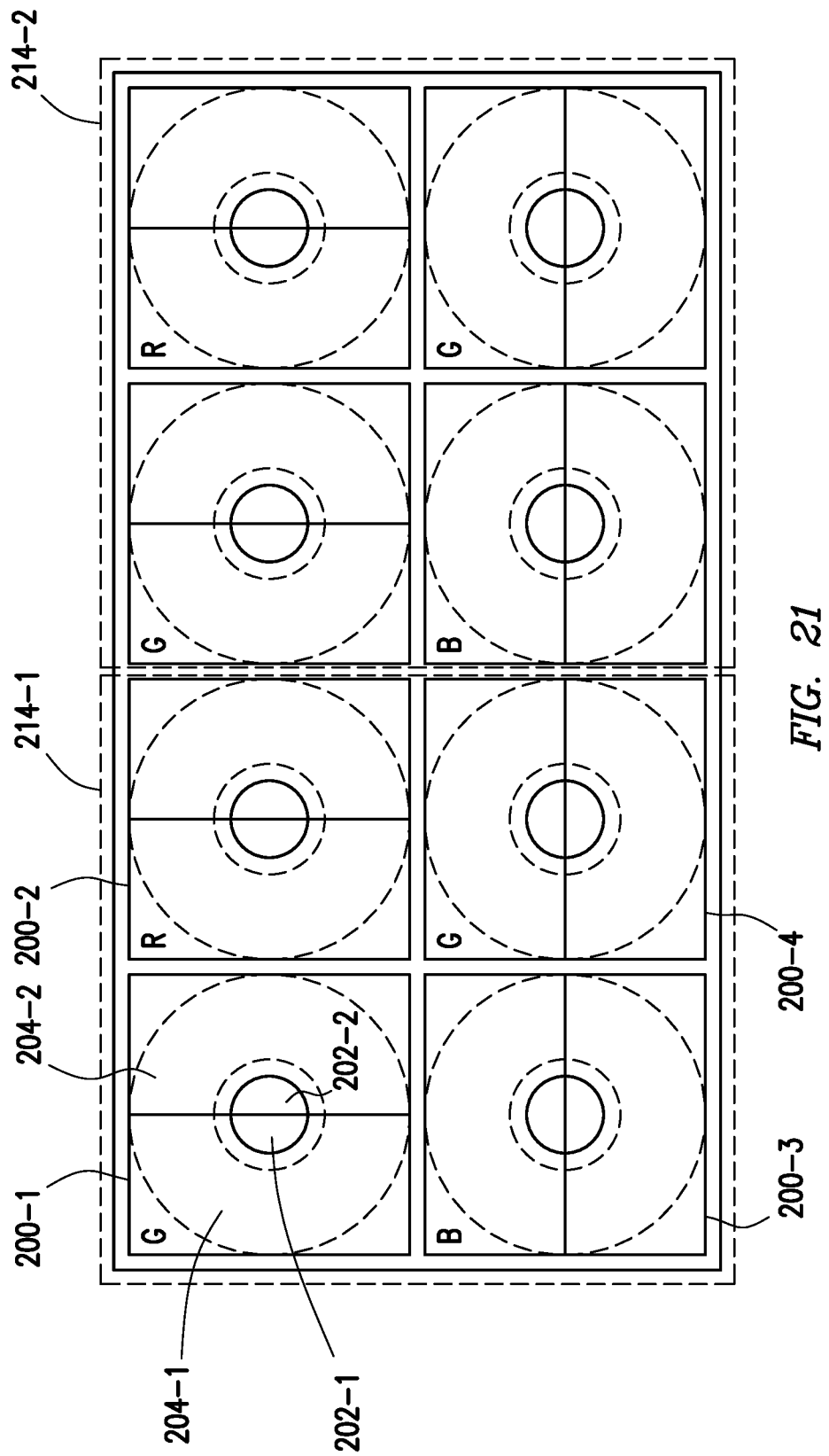
FIG. 21 is a top view of illustrative pixels with an outer sub-pixel group that surrounds an inner sub-pixel group that are arranged in a 2×2 repeating unit cell in accordance with an embodiment of the present invention.

FIG. 21 shows another exemplary pattern of pixels where each pixel has an outer sub-pixel group and an inner sub-pixel group. As shown in FIG. 21, repeating unit cell 214-1 may include four pixels in a two-by-two arrangement. Pixels 200-1, 200-2, 200-3, and 200-4 may be included in repeating unit cell 214-1. Each pixel in repeating unit cell 214-1 may include outer sub-pixels 204-1 and 204-2 that surround inner sub-pixel group 202. Each inner sub-pixel group 202 may include inner sub-pixels 202-1 and 202-2. The sub-pixels may enable the image sensor to gather phase detection data for both the inner and outer sub-pixels and have a high dynamic range. The orientation of the sub-pixels may be varied in different pixels in the unit cell. As shown in FIG. 21, pixels 200-1 and 200-2 (the upper left and upper right pixels, respectively) may both have horizontally oriented outer sub-pixels and horizontally oriented inner sub-pixels while pixels 200-3 and 200-4 (the lower left and lower right pixels, respectively) may both have vertically oriented outer sub-pixels and vertically oriented inner sub-pixels. By varying the orientation of pixels within the unit cell, the unit cell is able to gather multiple directions of phase detection data. Unit cell 214-1 may be repeated across the entire pixel array. As shown, the adjacent 2×2 group of pixels 214-2 is identical to the unit cell 214-1.

The example provided in FIG. 21 where the orientation of the inner sub-pixels matches the orientation of the outer sub-pixels is merely illustrative. If desired, pixels may be used in the repeating unit cell where the orientation of the inner sub-pixels is different from the orientation of the outer sub-pixels (as discussed in connection with FIG. 15).

Figure 22:
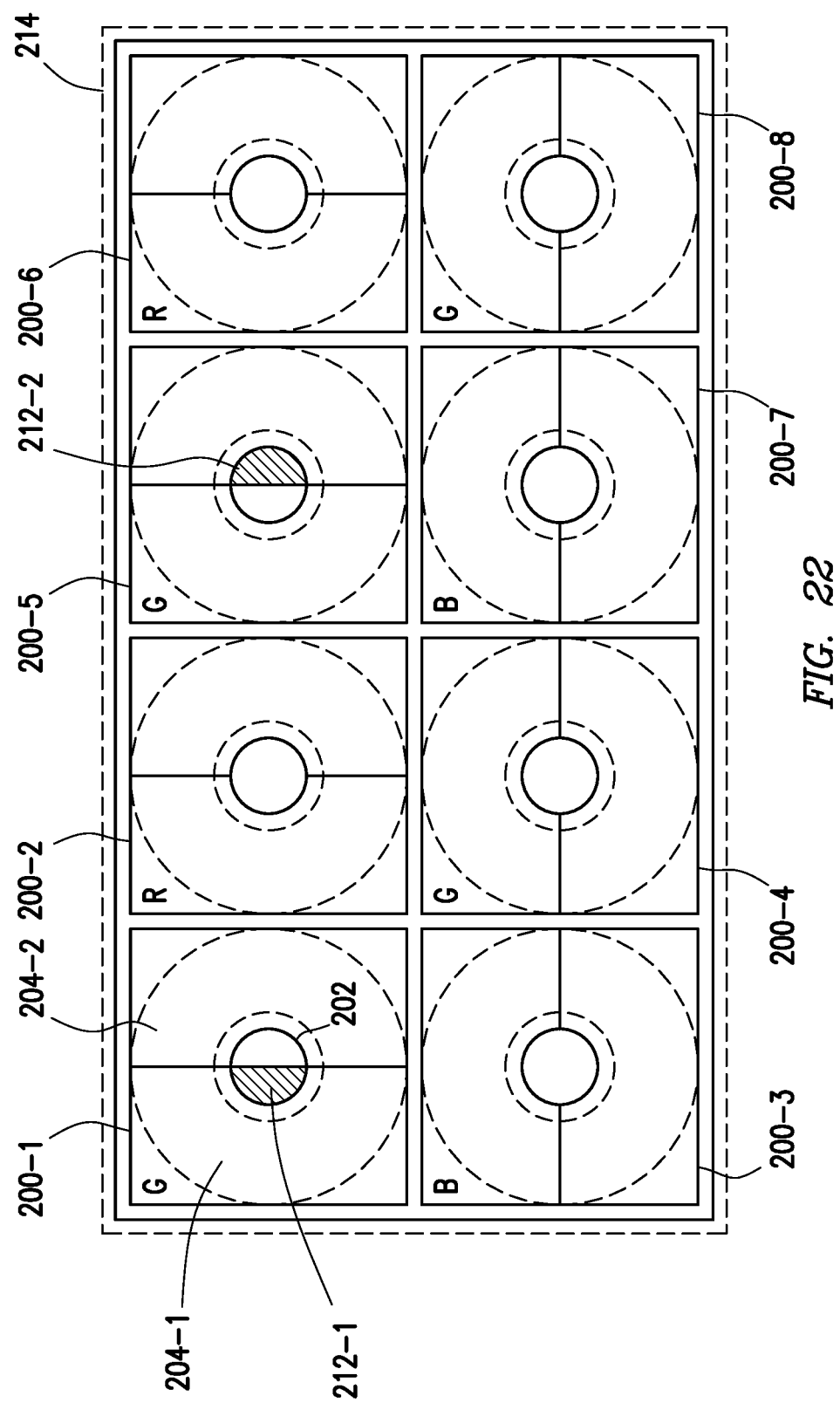
FIG. 22 is a top view of illustrative pixels arranged in a 2×4 repeating unit cell where shielding layers cover portions of inner sub-pixels in accordance with an embodiment of the present invention.

FIG. 22 shows yet another exemplary pattern of pixels where each pixel has an outer sub-pixel group and an inner sub-pixel group. As shown in FIG. 22, repeating unit cell 214 may include eight pixels in a two-by-four arrangement. Pixels 200-1, 200-2, 200-3, 200-4, 200-5, 200-6, 200-7, and 200-8 may be included in repeating unit cell 214. Each pixel in repeating unit cell 214 may include outer sub-pixels 204-1 and 204-2 that surround inner sub-pixel group 202. Each pixel's outer sub-pixels may gather phase detection information. The orientation of the outer sub-pixels may be varied in different pixels in the unit cell. As shown in FIG. 22, pixels 200-1, 200-2, 200-5, and 200-6 may have horizontally oriented outer sub-pixels while pixels 200-3, 200-4, 200-7, and 200-8 may have vertically oriented outer sub-pixels. By varying the orientation of the outer sub-pixels within the unit cell, the unit cell is able to gather multiple directions of phase detection data.

Additionally, repeating unit cell 214 may be provided with shielding layers to enable additional phase detection. The inner sub-pixels for pixels 200-2, 200-3, 200-4, 200-6, 200-7, and 200-8 may have symmetric angular responses to incident light and therefore may not be used to gather phase detection data. However, pixels 200-1 and 200-5 may be provided with shielding layers to cause inner sub-pixel 202 to have an asymmetric angular response to incident light (as discussed in connection with FIG. 16). As shown, shielding layer 212-1 may cover the left half of inner sub-pixel 202 in pixel 200-1, while shielding layer 212-2 may cover the right half of inner sub-pixel 202 in pixel 200-5. The data from the uncovered portions of inner sub-pixels 202 in pixels 200-1 and 200-5 may be used together to determine phase information.

Figure 23:
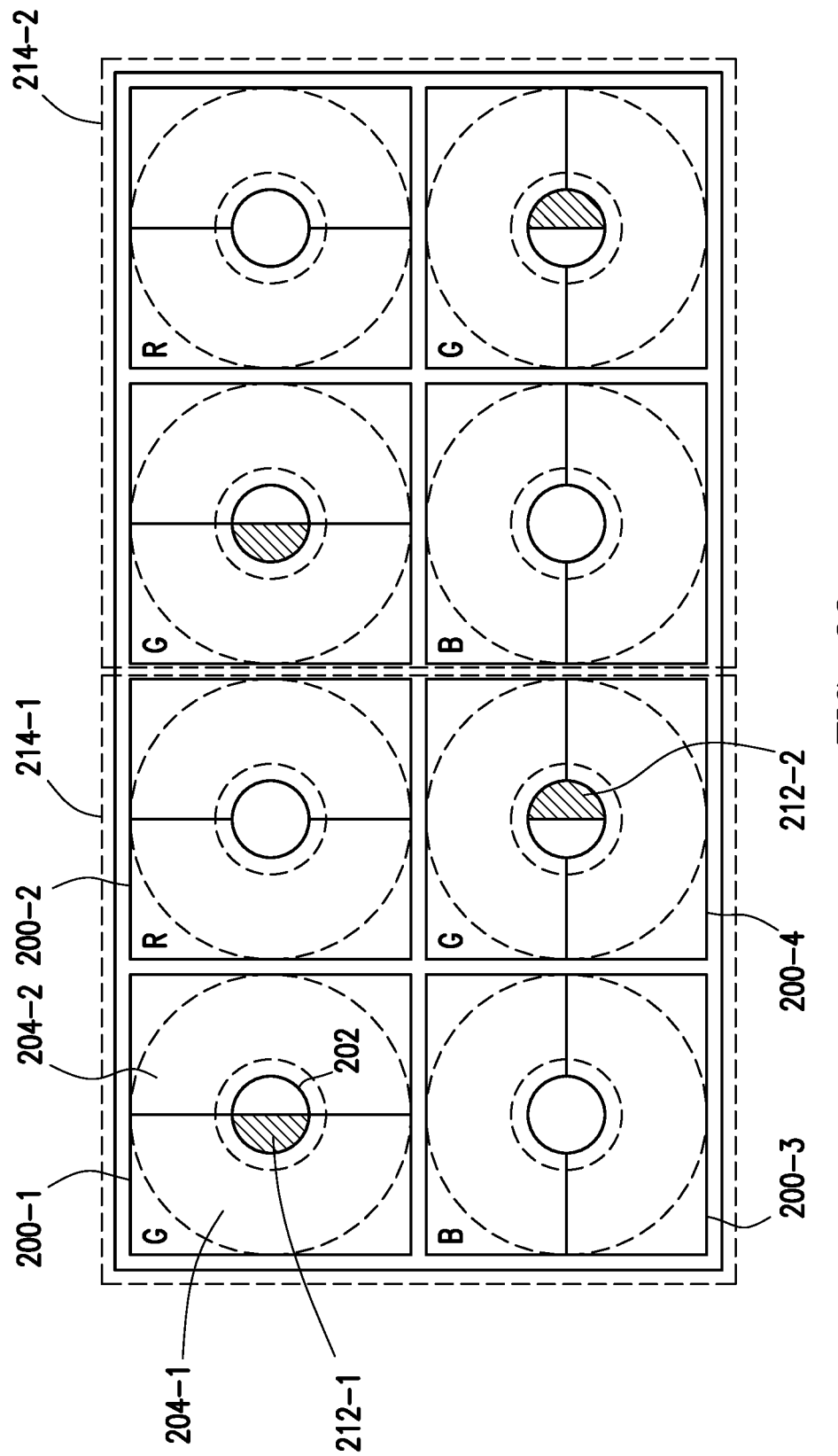
FIG. 23 is a top view of illustrative pixels arranged in a 2×2 repeating unit cell where shielding layers cover portions of inner sub-pixels in accordance with an embodiment of the present invention.

FIG. 23 shows another exemplary pattern of pixels where each pixel has an outer sub-pixel group and an inner sub-pixel and shielding layers partially covering the inner sub-pixels. As shown in FIG. 23, repeating unit cell 214-1 may include four pixels in a two-by-two arrangement. Pixels 200-1, 200-2, 200-3, and 200-4 may be included in repeating unit cell 214. Each pixel in repeating unit cell 214-1 may include outer sub-pixels 204-1 and 204-2 that surround inner sub-pixel group 202. Each pixel's outer sub-pixels may gather phase detection information. The orientation of the outer sub-pixels may be varied in different pixels in the unit cell. As shown in FIG. 23, pixels 200-1 and 200-2 may have horizontally oriented outer sub-pixels while pixels 200-3 and 200-4 may have vertically oriented outer sub-pixels. By varying the orientation of the outer sub-pixels within the unit cell, the unit cell is able to gather multiple directions of phase detection data.

Additionally, repeating unit cell 214 may be provided with shielding layers to enable additional phase detection. The inner sub-pixels for pixels 200-2 and 200-3 may have symmetric angular responses to incident light and therefore may not be used to gather phase detection data. However, pixels 200-1 and 200-4 may be provided with shielding layers to cause inner sub-pixel 202 to have an asymmetric angular response to incident light (as discussed in connection with FIG. 16). As shown, shielding layer 212-1 may cover the left half of inner sub-pixel 202 in pixel 200-1, while shielding layer 212-2 may cover the right half of inner sub-pixel 202 in pixel 200-4. The data from the uncovered portions of inner sub-pixels 202 in pixels 200-1 and 200-4 may be used together to determine phase information. Unit cell 214-1 may be repeated across the entire pixel array. As shown, the adjacent 2×2 group of pixels 214-2 is identical to the unit cell 214-1.

Figure 24:
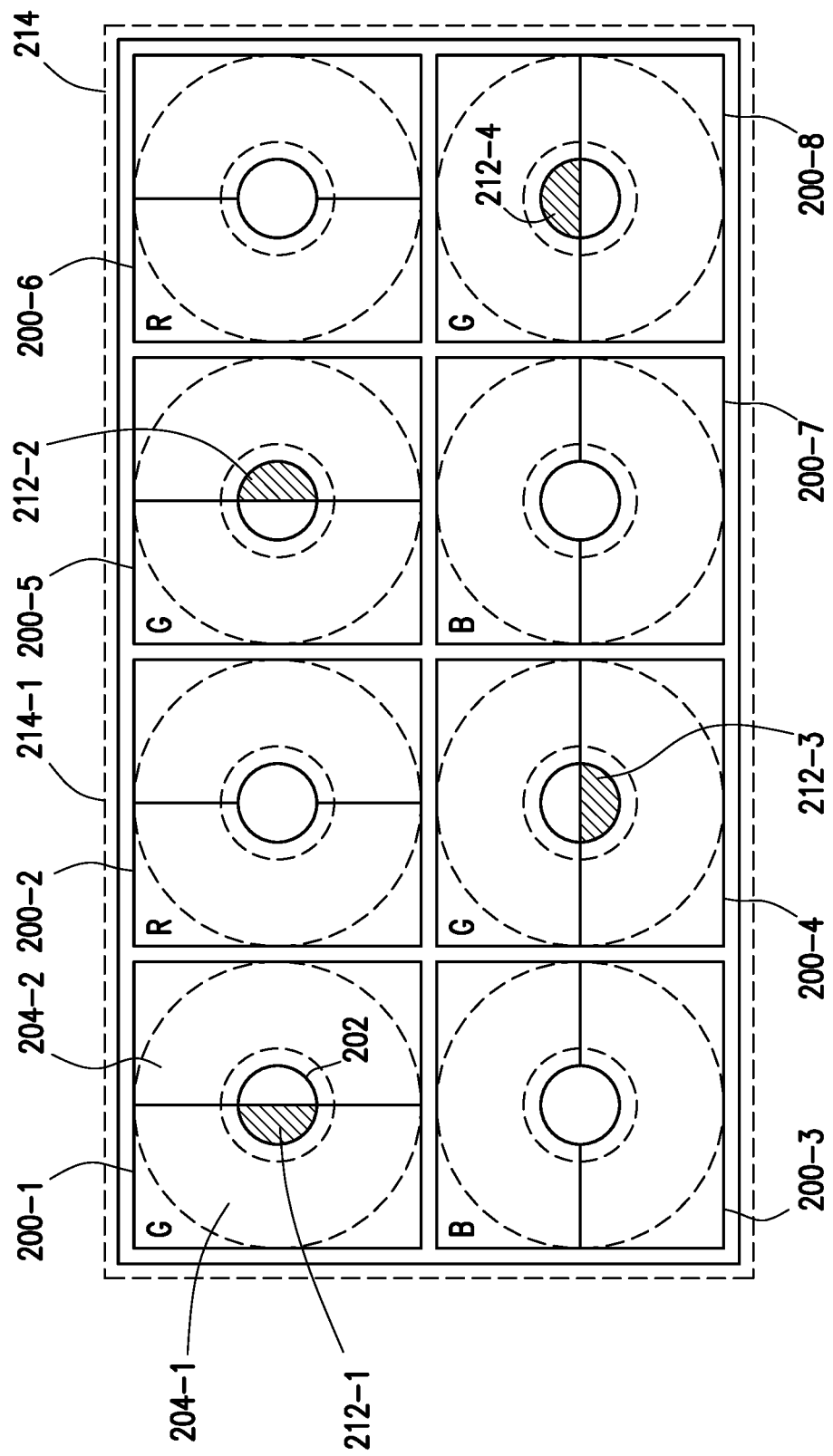
FIG. 24 is a top view of illustrative pixels arranged in a 2×4 repeating unit cell where shielding layers cover portions of inner sub-pixels in accordance with an embodiment of the present invention.

FIG. 24 shows yet another exemplary pattern of pixels where each pixel has an outer sub-pixel group and an inner sub-pixel group. As shown in FIG. 24, repeating unit cell 214 may include eight pixels in a two-by-four arrangement. Pixels 200-1, 200-2, 200-3, 200-4, 200-5, 200-6, 200-7, and 200-8 may be included in repeating unit cell 214. Each pixel in repeating unit cell 214 may include outer sub-pixels 204-1 and 204-2 that surround inner sub-pixel group 202. Each pixel's outer sub-pixels may gather phase detection information. The orientation of the outer sub-pixels may be varied in different pixels in the unit cell. As shown in FIG. 24, pixels 200-1, 200-2, 200-5, and 200-6 may have horizontally oriented outer sub-pixels while pixels 200-3, 200-4, 200-7, and 200-8 may have vertically oriented outer sub-pixels. By varying the orientation of the outer sub-pixels within the unit cell, the unit cell is able to gather multiple directions of phase detection data.

Additionally, repeating unit cell 214 may be provided with shielding layers to enable additional phase detection. The inner sub-pixels for pixels 200-2, 200-3, 200-6, and 200-7 may have symmetric angular responses to incident light and therefore may not be used to gather phase detection data. However, pixels 200-1 and 200-5 may be provided with shielding layers to cause inner sub-pixel 202 to have an asymmetric angular response to incident light (as discussed in connection with FIG. 16). As shown, shielding layer 212-1 may cover the left half of inner sub-pixel 202 in pixel 200-1, while shielding layer 212-2 may cover the right half of inner sub-pixel 202 in pixel 200-5. The data from the uncovered portions of inner sub-pixels 202 in pixels 200-1 and 200-5 may be used together to determine phase information. In particular, the data from the uncovered portions of inner sub-pixels 202 in pixels 200-1 and 200-5 may be used together to detect vertical edges in a scene. Additionally, pixels 200-4 and 200-8 may be provided with shielding layers to cause inner sub-pixel 202 to have an asymmetric angular response to incident light (as discussed in connection with FIG. 16). As shown, shielding layer 212-3 may cover the bottom half of inner sub-pixel 202 in pixel 200-4, while shielding layer 212-4 may cover the top half of inner sub-pixel 202 in pixel 200-8. The data from the uncovered portions of inner sub-pixels 202 in pixels 200-4 and 200-8 may be used together to determine phase information. In particular, the data from the uncovered portions of inner sub-pixels 202 in pixels 200-4 and 200-8 may be used together to detect horizontal edges in a scene.

Using the arrangement of FIG. 24, the outer sub-pixel groups and inner sub-pixel groups may both be able to detect vertical and horizontal edges. Additionally, because the inner sub-pixels are less sensitive to light than the outer sub-pixels, the pattern shown in FIG. 24 may be used to produce high dynamic range images.

FIGS. 19-24 show each pixel having a single toroidal microlens 206. However, this example is merely illustrative and each pixel may have any desired microlens arrangement. Each pixel in the pixel array may have the same microlens arrangement (as shown in FIGS. 19-24) or different pixels in the pixel array may have different microlens arrangements.

In various embodiments of the invention, an image pixel may include an inner sub-pixel group that exhibits a first light sensitivity and an outer sub-pixel group that includes at least one sub-pixel and that exhibits a second light sensitivity that is greater than the first light sensitivity. The inner sub-pixel group may include first and second inner sub-pixels, and the first and second inner sub-pixels may each have an asymmetric angular response to incident light and may be configured to generate phase detection data. The inner sub-pixel group may be nested within the outer sub-pixel group.

The image pixel may also include a color filter formed over the inner sub-pixel group and the outer sub-pixel group. The second light sensitivity may be at least four times greater than the first light sensitivity. The outer sub-pixel group may have a first geometric center, and the inner sub-pixel group may have a second geometric center that is the same as the first geometric center. The outer sub-pixel group may include first and second outer sub-pixels, and the first and second outer sub-pixels may each have an asymmetric angular response to incident light and may be configured to generate phase detection data. The first and second outer sub-pixels may be horizontally adjacent, and the first and second inner sub-pixels may be horizontally adjacent. The first and second outer sub-pixels may be horizontally adjacent, and the first and second inner sub-pixels may be vertically adjacent.

In various embodiments a pixel array may include a plurality of pixels. Each pixel of the plurality of pixels may have a structure that follows a pattern, the pattern may include a repeating unit cell of two-by-two pixels that is repeated across the entire pixel array, and the repeating unit cell of two-by-two pixels may include first, second, third, and fourth pixels. Each pixel may include an inner sub-pixel group that is nested within an outer sub-pixel group, each outer sub-pixel group may include first and second outer sub-pixels that are configured to generate phase detection data, the first and second outer sub-pixels of the first pixel may be horizontally adjacent, and the first and second outer sub-pixels of the second pixel may be vertically adjacent.

The first pixel may be an upper left pixel of the repeating unit cell of two-by-two pixels, the second pixel may be an upper right pixel of the repeating unit cell of two-by-two pixels, the third pixel may be a lower left pixel of the repeating unit cell of two-by-two pixels, the fourth pixel may be a lower right pixel of the repeating unit cell of two-by-two pixels, the first and second outer sub-pixels of the third pixel may be vertically adjacent, and the first and second outer sub-pixels of the fourth pixel may be horizontally adjacent. The first pixel may be covered by a green color filter element, the second pixel may be covered by a red color filter element, the third pixel may be covered by a blue color filter element, and the fourth pixel may be covered by a green color filter element.

The first pixel may be an upper left pixel of the repeating unit cell of two-by-two pixels, the second pixel may be a lower left pixel of the repeating unit cell of two-by-two pixels, the third pixel may be an upper right pixel of the repeating unit cell of two-by-two pixels, the fourth pixel may be a lower right pixel of the repeating unit cell of two-by-two pixels, the first and second outer sub-pixels of the third pixel may be horizontally adjacent, and the first and second outer sub-pixels of the fourth pixel may be vertically adjacent. The first pixel may be covered by a green color filter element, the second pixel may be covered by a blue color filter element, the third pixel may be covered by a red color filter element, and the fourth pixel may be covered by a green color filter element.

Each inner sub-pixel group may include first and second inner sub-pixels that are configured to generate phase detection data. The first and second inner sub-pixels of the first pixel may be horizontally adjacent, and the first and second inner sub-pixels of the second pixel may be vertically adjacent. The first and second inner sub-pixels of the first pixel may be vertically adjacent. The repeating unit cell of two-by-two pixels may also include a first shielding layer that covers a left half of the inner sub-pixel group of the third pixel and a second shielding layer that covers a right half of the inner sub-pixel group of the fourth pixel.

A pixel array may include a plurality of pixels. Each pixel of the plurality of pixels may have a structure that follows a pattern, the pattern may include a repeating unit cell of two-by-four pixels that is repeated across the entire pixel array, and the repeating unit cell of two-by-four pixels may include a first two-by-two group of pixels and a second two-by-two group of pixels that is adjacent to the first two-by-two group of pixels. The first two-by-two group of pixels may include an upper left pixel, an upper right pixel, a lower left pixel, and a lower right pixel that each have first and second sub-pixels that are arranged in a respective orientation and are configured to generate phase detection data. The second two-by-two group of pixels may include an upper left pixel, an upper right pixel, a lower left pixel, and a lower right pixel that each have first and second sub-pixels that are arranged in a respective orientation and are configured to generate phase detection data. The orientations of the pixels in the second two-by-two group of pixels may be the opposite of the orientations of the pixels in the first two-by-two group of pixels.

The upper left pixel in the first two-by-two group of pixels may have first and second sub-pixels that are horizontally adjacent, the upper left pixel in the second two-by-two group of pixels may have first and second sub-pixels that are vertically adjacent, the upper right pixel in the first two-by-two group of pixels may have first and second sub-pixels that are horizontally adjacent, the upper right pixel in the second two-by-two group of pixels may have first and second sub-pixels that are vertically adjacent, the lower left pixel in the first two-by-two group of pixels may have first and second sub-pixels that are vertically adjacent, the lower left pixel in the second two-by-two group of pixels may have first and second sub-pixels that are horizontally adjacent, the lower right pixel in the first two-by-two group of pixels may have first and second sub-pixels that are vertically adjacent, and the lower right pixel in the second two-by-two group of pixels may have first and second sub-pixels that are horizontally adjacent.

The upper left pixel in the first two-by-two group of pixels may have first and second sub-pixels that are horizontally adjacent, the upper left pixel in the second two-by-two group of pixels may have first and second sub-pixels that are vertically adjacent, the upper right pixel in the first two-by-two group of pixels may have first and second sub-pixels that are vertically adjacent, the upper right pixel in the second two-by-two group of pixels may have first and second sub-pixels that are horizontally adjacent, the lower left pixel in the first two-by-two group of pixels may have first and second sub-pixels that are vertically adjacent, the lower left pixel in the second two-by-two group of pixels may have first and second sub-pixels that are horizontally adjacent, the lower right pixel in the first two-by-two group of pixels may have first and second sub-pixels that are horizontally adjacent, and the lower right pixel in the second two-by-two group of pixels may have first and second sub-pixels that are vertically adjacent.

The upper left pixel in the first two-by-two group of pixels and the upper left pixel in the second two-by-two group of pixels may both be covered by respective color filter elements of a first color, the upper right pixel in the first two-by-two group of pixels and the upper right pixel in the second two-by-two group of pixels may both be covered by respective color filter elements of a second color, the lower left pixel in the first two-by-two group of pixels and the lower left pixel in the second two-by-two group of pixels may both be covered by respective color filter elements of a third color, and the lower right pixel in the first two-by-two group of pixels and the lower right pixel in the second two-by-two group of pixels may both be covered by respective color filter elements of a fourth color.

The foregoing is merely illustrative of the principles of this invention and various modifications can be made by those skilled in the art without departing from the scope and spirit of the invention.

What is claimed is:

1. A pixel array comprising a plurality of pixels, wherein each pixel of the plurality of pixels has a structure that follows a pattern, wherein the pattern comprises a repeating unit cell of two-by-two pixels that is repeated across the pixel array, and wherein the repeating unit cell of two-by-two pixels comprises:
   first, second, third, and fourth pixels, wherein each pixel comprises an inner sub-pixel group that is nested within an outer sub-pixel group, wherein each outer sub-pixel group comprises first and second outer sub-pixels that are configured to generate phase detection data, wherein the first and second outer sub-pixels of the first pixel have a first orientation, and wherein the first and second outer sub-pixels of the second pixel have a second orientation that is different than the first orientation.

2. The pixel array defined in claim 1, wherein the first pixel is an upper left pixel of the repeating unit cell of two-by-two pixels, wherein the second pixel is an upper right pixel of the repeating unit cell of two-by-two pixels, wherein the third pixel is a lower left pixel of the repeating unit cell of two-by-two pixels, wherein the fourth pixel is a lower right pixel of the repeating unit cell of two-by-two pixels, and wherein the first orientation is orthogonal to the second orientation.

3. The pixel array defined in claim 2, wherein the first and second outer sub-pixels of the first pixel are horizontally adjacent and wherein the first and second outer sub-pixels of the second pixel are vertically adjacent.

4. The pixel array defined in claim 3, wherein the first and second outer sub-pixels of the third pixel are vertically adjacent and wherein the first and second outer sub-pixels of the fourth pixel are horizontally adjacent.

5. The pixel array defined in claim 2, wherein the first pixel is covered by a green color filter element, wherein the second pixel is covered by a red color filter element, wherein the third pixel is covered by a blue color filter element, and wherein the fourth pixel is covered by a green color filter element.

6. The pixel array defined in claim 1, wherein the first pixel is an upper left pixel of the repeating unit cell of two-by-two pixels, wherein the second pixel is a lower left pixel of the repeating unit cell of two-by-two pixels, wherein the third pixel is an upper right pixel of the repeating unit cell of two-by-two pixels, wherein the fourth pixel is a lower right pixel of the repeating unit cell of two-by-two pixels, wherein the first and second outer sub-pixels of the first pixel are horizontally adjacent, wherein the first and second outer sub-pixels of the second pixel are vertically adjacent, wherein the first and second outer sub-pixels of the third pixel are horizontally adjacent, and wherein the first and second outer sub-pixels of the fourth pixel are vertically adjacent.

7. The pixel array defined in claim 6, wherein the first pixel is covered by a green color filter element, wherein the second pixel is covered by a blue color filter element, wherein the third pixel is covered by a red color filter element, and wherein the fourth pixel is covered by a green color filter element.

8. The pixel array defined in claim 1, wherein each inner sub-pixel group comprises first and second inner sub-pixels that are configured to generate phase detection data.

9. The pixel array defined in claim 8, wherein the first and second inner sub-pixels of the first pixel have the first orientation and wherein the first and second inner sub-pixels of the second pixel have the second orientation.

10. The pixel array defined in claim 8, wherein the first and second inner sub-pixels of the first pixel have the second orientation.

11. The pixel array defined in claim 1, wherein the repeating unit cell of two-by-two pixels further comprises:
a first shielding layer that covers a first half of the inner sub-pixel group of the third pixel; and
a second shielding layer that covers a second half of the inner sub-pixel group of the fourth pixel.

12. A pixel array comprising a plurality of pixels, wherein each pixel of the plurality of pixels has a structure that follows a pattern, wherein the pattern comprises a repeating unit cell of two-by-four pixels that is repeated across the pixel array, and wherein the repeating unit cell of two-by-four pixels comprises:
a first two-by-two group of pixels, wherein the first two-by-two group of pixels includes an upper left pixel, an upper right pixel, a lower left pixel, and a lower right pixel that each have first and second outer sub-pixels and a inner sub-pixel group nested within the first and second outer sub-pixels and wherein the first and second outer sub-pixels in the first two-by-two group are arranged in a respective orientation and are configured to generate phase detection data; and
a second two-by-two group of pixels that is adjacent to the first two-by-two group of pixels, wherein the second two-by-two group of pixels includes an upper left pixel, an upper right pixel, a lower left pixel, and a lower right pixel that each have first and second outer sub-pixels and an inner sub-pixel group nested within the first and second outer sub-pixels, wherein the first and second outer sub-pixels in the second two-by-two group are arranged in a respective orientation and are configured to generate phase detection data, and wherein the orientations of the pixels in the second two-by-two group of pixels are different than the orientations of the pixels in the first two-by-two group of pixels.

13. The pixel array defined in claim 12, wherein the upper left pixel in the first two-by-two group of pixels has first and second outer sub-pixels arranged in a first orientation, wherein the upper left pixel in the second two-by-two group of pixels has first and second outer sub-pixels arranged in a second orientation, wherein the upper right pixel in the first two-by-two group of pixels has first and second outer sub-pixels arranged in the first orientation, and wherein the upper right pixel in the second two-by-two group of pixels has first and second outer sub-pixels arranged in the second orientation.

14. The pixel array defined in claim 13, wherein the lower left pixel in the first two-by-two group of pixels has first and second outer sub-pixels arranged in the second orientation, wherein the lower left pixel in the second two-by-two group of pixels has first and second outer sub-pixels arranged in the first orientation, wherein the lower right pixel in the first two-by-two group of pixels has first and second outer sub-pixels arranged in the second orientation, and wherein the lower right pixel in the second two-by-two group of pixels has first and second outer sub-pixels arranged in the first orientation.

15. The pixel array defined in claim 14, wherein first and second outer sub-pixels arranged in the first orientation are horizontally adjacent and first and second sub-outer pixels arranged in the second orientation are vertically adjacent.

16. The pixel array defined in claim 14, wherein the first orientation and the second orientation are orthogonal.

17. The pixel array defined in claim 12, wherein the upper left pixel in the first two-by-two group of pixels has first and second outer sub-pixels arranged in a first orientation, wherein the upper left pixel in the second two-by-two group of pixels has first and second outer sub-pixels arranged in a second orientation, wherein the upper right pixel in the first two-by-two group of pixels has first and second outer sub-pixels arranged in the second orientation, wherein the upper right pixel in the second two-by-two group of pixels has first and second outer sub-pixels arranged in the first orientation, wherein the lower left pixel in the first two-by-two group of pixels has first and second outer sub-pixels arranged in the second orientation, wherein the lower left pixel in the second two-by-two group of pixels has first and second outer sub-pixels arranged in the first orientation, wherein the lower right pixel in the first two-by-two group of pixels has first and second outer sub-pixels arranged in the first orientation, and wherein the lower right pixel in the second two-by-two group of pixels has first and second outer sub-pixels arranged in the second orientation.

18. The pixel array defined in claim 12, wherein the upper left pixel in the first two-by-two group of pixels and the upper left pixel in the second two-by-two group of pixels are both covered by respective color filter elements of a first color, wherein the upper right pixel in the first two-by-two group of pixels and the upper right pixel in the second two-by-two group of pixels are both covered by respective color filter elements of a second color, wherein the lower left pixel in the first two-by-two group of pixels and the lower left pixel in the second two-by-two group of pixels are both covered by respective color filter elements of a third color, and wherein the lower right pixel in the first two-by-two group of pixels and the lower right pixel in the second two-by-two group of pixels are both covered by respective color filter elements of a fourth color.

19. A pixel array comprising a plurality of pixels, wherein each pixel of the plurality of pixels has a structure that follows a pattern, wherein the pattern comprises a repeating unit cell of two-by-two pixels that is repeated across the pixel array, and wherein the repeating unit cell of two-by-two pixels comprises:
first, second, third, and fourth pixels, wherein each pixel comprises first and second sub-pixels that are configured to generate phase detection data, wherein the first and second sub-pixels are the only sub-pixels formed in each pixel, wherein the first and second sub-pixels of the first pixel have a first orientation, and wherein the first and second sub-pixels of the second pixel have a second orientation that is different than the first orientation.

20. The pixel array defined in claim 19, wherein the second orientation is perpendicular to the first orientation.

* * * * *